(12) United States Patent
Kim et al.

(10) Patent No.: US 11,903,270 B2
(45) Date of Patent: Feb. 13, 2024

(54) DISPLAY DEVICE, METHOD OF MANUFACTURING THE SAME, AND TILED DISPLAY DEVICE HAVING THE SAME

(71) Applicant: Samsung Display Co., Ltd., Yongin-si (KR)

(72) Inventors: Duk Sung Kim, Yongin-si (KR); Jung Hyun Kwon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 17/119,457

(22) Filed: Dec. 11, 2020

(65) Prior Publication Data

US 2021/0280662 A1 Sep. 9, 2021

(30) Foreign Application Priority Data

Mar. 5, 2020 (KR) .................. 10-2020-0027841

(51) Int. Cl.
| | |
|---|---|
| *H01L 21/00* | (2006.01) |
| *H10K 59/131* | (2023.01) |
| *H10K 50/813* | (2023.01) |
| *H10K 50/822* | (2023.01) |
| *H10K 59/18* | (2023.01) |
| *H10K 59/38* | (2023.01) |
| *H10K 59/124* | (2023.01) |
| *H10K 71/00* | (2023.01) |

(52) U.S. Cl.
CPC ......... *H10K 59/131* (2023.02); *H10K 50/813* (2023.02); *H10K 50/822* (2023.02); *H10K 59/124* (2023.02); *H10K 59/18* (2023.02); *H10K 59/38* (2023.02); *H10K 71/00* (2023.02)

(58) Field of Classification Search
CPC .................................................... H10K 59/131
See application file for complete search history.

(56) References Cited

U.S. PATENT DOCUMENTS

| | | | |
|---|---|---|---|
| 10,580,846 B2 | 3/2020 | Seo et al. | |
| 11,195,890 B2 * | 12/2021 | Jing | ..................... H10K 77/111 |
| 2016/0329386 A1 * | 11/2016 | Sauers | ................. H10K 77/111 |
| 2020/0013766 A1 | 1/2020 | Kim | |

FOREIGN PATENT DOCUMENTS

| | | |
|---|---|---|
| KR | 10-2018-0100013 A | 9/2018 |
| KR | 10-2019-0079283 A | 7/2019 |
| KR | 10-2013323 B1 | 8/2019 |
| KR | 10-2020-0005692 A | 1/2020 |

* cited by examiner

*Primary Examiner* — Douglas M Menz
(74) *Attorney, Agent, or Firm* — Lewis Roca Rothgerber Christie LLP

(57) ABSTRACT

A display device includes: a substrate having a display area configured to display an image; a pixel on a first surface of the substrate in the display area and including a display element layer and a pixel circuit layer; a first driver on a second surface of the substrate facing the first surface of the substrate in the display area; and a first connection portion passing through the substrate between the first surface and the second surface of the substrate in the display area to electrically connect a first signal line of the pixel circuit layer and the first driver to each other. The display element layer includes: a first electrode and a second electrode on the same layer and spaced from each other; and a light emitting element between the first electrode and the second electrode.

11 Claims, 21 Drawing Sheets

DISPLAY DEVICE, METHOD OF MANUFACTURING THE SAME, AND TILED DISPLAY DEVICE HAVING THE SAME

CROSS-REFERENCE TO RELATED APPLICATION

This application claims priority to and the benefit of Korean Patent Application No. 10-2020-0027841, filed on Mar. 5, 2020, the content of which is herein incorporated by reference in its entirety.

BACKGROUND

1. Field

Aspects of embodiments of the present disclosure relate to a display device, a method of manufacturing the same, and a tiled display device having the same.

2. Description of the Related Art

A display device may display an image by using a light emitting element, such as a light emitting diode (LED) as a light source of a pixel. The light emitting diode exhibits relatively excellent durability even in a poor environmental condition and exhibits excellent performance in terms of life and luminance. Research toward manufacturing a highly-reliable light emitting diode by using a material having an inorganic crystal structure and using the light emitting diode as a pixel light source by disposing the light emitting diode on a display panel of a display device is being conducted.

A tiled display device, which includes a plurality of display panels, may have a non-display area (e.g. a bezel area) that is recognizable by a user. Therefore, the display panels may be recognized as separate screens and immersion of the user may be disturbed. Accordingly, a display panel and a display device in which the non-display area is reduced or minimized is desired.

SUMMARY

Embodiments of the present disclosure provide a display device in which a non-display area is reduced or minimized and a method of manufacturing the same.

Other embodiments of the present disclosure provide a tiled display device including display panels in which a non-display area is reduced or minimized.

Aspects and features of the present disclosure are not limited to those described above, and other aspects and features which are not expressly described herein will be clearly understood by those skilled in the art from the following description.

A display device according to an embodiment of the present disclosure includes: a substrate having a display area configured to display an image; a pixel on a first surface of the substrate in the display area, the pixel including a display element layer and a pixel circuit layer; a first driver on a second surface of the substrate facing the first surface of the substrate in the display area; and a first connection portion passing through the substrate between the first surface and the second surface of the substrate in the display area to electrically connect a first signal line of the pixel circuit layer and the first driver to each other. The display element layer includes: a first electrode and a second electrode on the same layer and spaced from each other; and a light emitting element between the first electrode and the second electrode.

The display device may further include: a second driver on the second surface of the substrate in the display area; and a second connection portion passing through the substrate between the first surface and the second surface of the substrate to electrically connect a second signal line of the pixel circuit layer and the second driver to each other. The first driver may be configured to supply a scan signal to the first signal line, and the second driver may be configured to supply a data signal to the second signal line.

The pixel circuit layer may further include a transistor electrically connected to the light emitting element. The transistor may include: a semiconductor layer on the first surface of the substrate; a gate electrode on the semiconductor layer; and a first transistor electrode and a second transistor electrode on the gate electrode and connected to the semiconductor layer. The first signal line may be on the same layer as the gate electrode.

The second signal line may be on the same layer as at least one of the first transistor electrode and the second transistor electrode.

The pixel circuit layer may further include an intermediate electrode contacting the second signal line and the second connection portion, and the intermediate electrode may be on the same layer as the first signal line.

The display device may further include a capping layer on the second surface of the substrate and covering the first connection portion and the second connection portion. The first connection portion may include a first through electrode passing through the substrate and a first fan-out electrode on the second surface of the substrate, the second connection portion may include a second through electrode passing through the substrate and a second fan-out electrode on the second surface of the substrate, and the capping layer may have a first pad opening exposing a portion of the first fan-out electrode and a second pad opening exposing a portion of the second fan-out electrode.

The display device may further include: a first connection film electrically connected to the first fan-out electrode through the first pad opening; and a second connection film electrically connected to the second fan-out electrode through the second pad opening. The first driver may be on the first connection film, and the second driver may be on the second connection film.

The display element layer may include: an insulating layer on the first electrode and the second electrode; a third electrode contacting the first electrode and a first end portion of the light emitting element; and a fourth electrode contacting the second electrode and a second end portion of the light emitting element. The insulating layer may have a first opening exposing at least a portion of the first electrode and a second opening exposing at least a portion of the second electrode. The third electrode may contact the first electrode through the first opening, and the fourth electrode may contact the second electrode through the second opening.

The display element layer may include: a wavelength conversion layer on the light emitting element; and a color filter layer on the wavelength conversion layer. The wavelength conversion layer may include a wavelength conversion particle and a scattering particle.

The light emitting element may include an inorganic material, and the pixel may include a plurality of the light emitting elements.

A method of manufacturing a display device according to an embodiment of the present disclosure includes: forming a display element layer and a pixel circuit layer on a first surface of a substrate; forming an opening passing through the substrate from a second surface facing the first surface to the first surface of the substrate to expose at least a portion of the pixel circuit layer; filling the opening from the second surface of the substrate and forming a connection portion contacting the exposed portion of the pixel circuit layer; and forming a capping layer having a pad opening exposing a portion of the connection portion on the second surface of the substrate. The opening is formed in a display area of the substrate at where an image is displayed.

The method may further include disposing a connection film and a driver electrically connected to the connection portion through the pad opening.

The forming of the display element layer may include: forming a first electrode and a second electrode spaced apart from each other on the same layer; and disposing a light emitting element between the first electrode and the second electrode.

The forming of the display element layer may include: forming a wavelength conversion layer on the light emitting element; and forming a color filter layer on the wavelength conversion layer. The wavelength conversion layer may include a wavelength conversion particle and a scattering particle.

A tiled display device according to an embodiment of the present disclosure includes: an arrangement including a plurality of display panels, each of the display panels including: a substrate having a display area configured to display an image; a pixel on a first surface of the substrate, in the display area, and including a display element layer and a pixel circuit layer; a driver on a second surface facing the first surface of the substrate and in the display area; and a connection portion passing through the substrate between the first surface and the second surface of the substrate to electrically connect a signal line of the pixel circuit layer and the driver to each other. The display element layer includes: a first electrode and a second electrode on the same layer and spaced from each other; and a plurality of light emitting elements between the first electrode and the second electrode and configuring the pixel.

The display panels may include: a first display panel and a second display panel adjacent to each other in a first direction; and a third display panel adjacent to the first display panel in a second direction crossing the first direction. A distance between a first pixel on an outermost portion of the first display panel adjacent to the second display panel and a second pixel on an outermost portion of the second display panel and nearest to the first pixel in the first direction may be equal to or less than a distance between adjacent pixels in the first display panel in the first direction.

The first display panel may include a third pixel adjacent to the first pixel in a direction opposite to the first direction, and a width of the first pixel in the first direction may be less than a width of the third pixel in the first direction.

The light emitting elements of the first pixel may be arranged in a first number of columns, the light emitting elements of the third pixel may be arranged in a second number of columns. The first number of columns may be less than the second number of columns.

The first display panel may further include: a fourth pixel on an outermost portion of the first display panel adjacent to the third display panel; and a fifth pixel adjacent to the fourth pixel in a direction opposite to the second direction. A width of the fourth pixel in the second direction may be less than a width of the fifth pixel in the second direction.

A length of the first electrode of the fourth pixel in the second direction may be less than a length of the first electrode of the fifth pixel in the second direction.

According to embodiments of the present disclosure, a display device in which a non-display area is reduced or minimized and a method of manufacturing the same is provided.

In addition, according to embodiments of the present disclosure, a tiled display device including display panels in which a non-display area is reduced or minimized may be provided. Therefore, a visibility defect, such as visual recognition of a bezel or a boundary between the display panels of the tiled display device, may be mitigated.

Aspects and features according to embodiments of the present disclosure are not limited by the details described above, and additional, various aspects and features are included in the present disclosure.

BRIEF DESCRIPTION OF THE DRAWINGS

The above and other aspects and features of the present disclosure will become more apparent by describing, in further detail, embodiments thereof with reference to the accompanying drawings, in which.

DETAILED DESCRIPTION

Figure 1A:
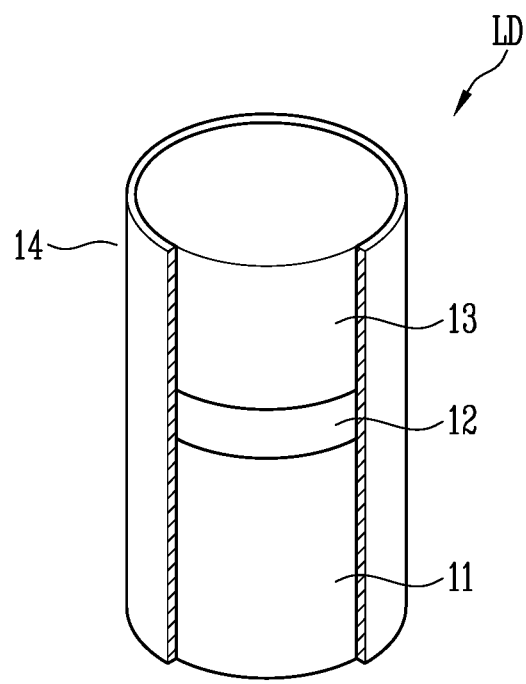
FIGS. 1A and 1B are perspective views of light emitting elements according to embodiments.

Aspects and features of the present disclosure and a method of achieving them will become apparent with reference to the embodiments described, in detail, below together with the accompanying drawings. However, the present disclosure is not limited to the embodiments disclosed below and may be implemented in various different forms. The described embodiments are provided so that the present disclosure will be thorough and complete and those skilled in the art to which the present disclosure pertains can fully understand the scope of the present disclosure. The present disclosure is defined by the scope of the claims and their equivalents.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numerals denote to the same components throughout the specification. A shape, size, ratio, angle, number, and the like shown in the drawings for describing embodiments are exemplary, and thus, the present disclosure is not limited thereto. Some components may be omitted or exaggerated for clarity of embodiments.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

the present disclosure. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

Aspect and features of various embodiments of the present disclosure may be combined with each other in part or in whole. Each embodiment may be implemented independently of each other or may be associated with each other, in part or in whole, and be implemented together.

Hereinafter, embodiments of the present disclosure will be described in detail with reference to the accompanying drawings.

Figure 1B:
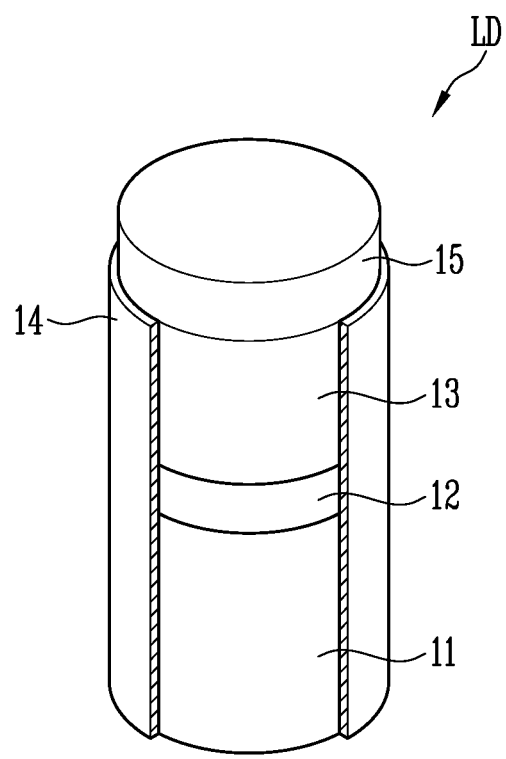

FIGS. 1A and 1B are perspective views of light emitting elements according to embodiments.

Referring to FIGS. 1A and 1B, the light emitting element LD according to embodiments of the present disclosure may include a first semiconductor layer 11, a second semiconductor layer 13, and an active layer 12 interposed between the first and second semiconductor layers 11 and 13. For example, the light emitting element LD may be implemented as a stack in which the first semiconductor layer 11, the active layer 12, and the second semiconductor layer 13 are sequentially stacked.

According to an embodiment of the present disclosure, the light emitting element LD may be provided in a rod shape extending in one direction. Herein, the term "rod shape" may include a rod-like shape or a bar-like shape that is long in the length direction (e.g., has an aspect ratio greater than 1), such as a cylinder or a polygonal column. For example, a length of the light emitting element LD may be greater than a diameter thereof. However, the present disclosure is not limited thereto. The light emitting element LD may be a growth-type light emitting element having a core-shell structure.

When an extension direction of the light emitting element LD is a length direction thereof, the light emitting element LD may have one end portion and another end portion along the length direction. In an embodiment of the present disclosure, one of the first and second semiconductor layers 11 and 13 may be disposed at the one end portion, and the other of the first and second semiconductor layers 11 and 13 may be disposed at the other end portion.

For example, the light emitting element LD may be manufactured to have a diameter and/or length on a micro scale or a nano scale (e.g., about 100 µm to about 100 nm). For example, the diameter of the light emitting element LD may be equal to or less than about 600 nm, and the length of the light emitting element LD may be equal to or less than about 4 µm, but a size of the light emitting element LD is not limited thereto. The size of the light emitting element LD may be variously modified according to conditions of the display device to which the light emitting element LD is to be applied.

For example, the first semiconductor layer 11 may include at least one n-type semiconductor layer. For example, the first semiconductor layer 11 may include a semiconductor material including any one or more of InAlGaN, GaN, AlGaN, InGaN, AlN, and InN and may include a semiconductor layer in which a first dopant, such as Si, Ge, or Sn, is doped. The material of (e.g., the material configuring or forming) the first semiconductor layer 11 is not limited thereto, and various suitable materials other than the materials described above may configure the first semiconductor layer 11.

The active layer 12 may be formed on the first semiconductor layer 11 and may be formed having a single or multi-quantum well structure. When the active layer 12 includes a material having the multi-quantum well structure, the active layer 12 may be a structure in which a quantum layer and a well layer are alternately stacked with each other.

When an electric field of a reference voltage or more (e.g., a predetermined voltage or more) is applied to both (e.g., opposite) end portions of the light emitting element LD, the light emitting element LD emits light while an electron-hole pair is coupled in the active layer 12. By controlling the light emission of the light emitting element LD by using such a principle, the light emitting element LD may be used as a light source of various light emitting devices including as a pixel of the display device.

The active layer 12 may emit light having a wavelength of about 400 nm to about 900 nm. For example, when the active layer 12 emits light in a blue wavelength band, the active layer 12 may include an inorganic material, such as AlGaN or AlGaInN. For example, when the active layer 12 has the multi-quantum well structure in which the quantum layer and the well layer are alternately stacked on each other, the quantum layer may include an inorganic material, such as AlGaN or AlGaInN, and the well layer may include an inorganic material, such as GaN or AlInN. In an exemplary embodiment, the active layer 12 may include AlGaInN as the quantum layer and AlInN as the well layer, and as described above, the active layer 12 may emit blue light having a central wavelength band in a range of about 450 nm to about 495 nm.

However, the present disclosure is not limited thereto, and the active layer 12 may be a structure in which a semiconductor material with relatively large band gap energy and semiconductor materials with relatively small band gap energy are alternately stacked with each other, or may include group 3 to 5 semiconductor materials according to a wavelength band of emitted light. The light emitted by the active layer 12 is not limited to the light in the blue wavelength band and may be light in a red or green wavelength band according to different embodiments.

The light emitted from the active layer 12 may be emitted to both sides as well as an outer surface (e.g., a peripheral surface) of the length direction of the light emitting element LD. That is, directivity of the light emitted from the active layer 12 is not limited to one direction.

The second semiconductor layer 13 may be provided on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material from among InAlGaN, GaN, AlGaN, InGaN, AlN, and InN and may include a semiconductor layer in which a second dopant, such as Mg, Zn, Ca, Se, or Ba, is doped. The material of (e.g., forming or configuring) the second semiconductor layer 13 is not limited thereto, and various suitable materials other than the materials described above may configure the second semiconductor layer 13.

In the drawings, the first semiconductor layer 11 and the second semiconductor layer 13 are shown as being one layer but are not limited thereto. For example, the first semiconductor layer 11 and the second semiconductor layer 13 may include a greater number of layers according to the material of the active layer 12. For example, the first semiconductor layer 11 and the second semiconductor layer 13 may further include a clad layer or a tensile strain barrier reducing (TSBR) layer.

According to an embodiment of the present disclosure, the light emitting element LD may further include different fluorescent layers, active layers, semiconductor layers, and/or electrode layers on and/or under each layer, in addition to the above-described first semiconductor layer 11, active layer 12, and second semiconductor layer 13.

The light emitting element LD may further include at least one electrode layer disposed on one end side (e.g., an upper surface of the light emitting element LD) of the second semiconductor layer 13 or one end side (e.g., a lower surface of the light emitting element LD) of the first semiconductor layer 11. For example, the light emitting element LD may further include an electrode layer 15 disposed on one end side of the second semiconductor layer 13 as shown in FIG. 1B. The electrode layer 15 may be an ohmic electrode but is not limited thereto. For example, the electrode layer 15 may be a Schottky contact electrode. The electrode layer 15 may include a metal or a metal oxide, for example, chromium (Cr), titanium (Ti), aluminum (Al), gold (Au), nickel (Ni), indium tin oxide (ITO), indium zinc oxide (IZO), indium tin-zinc oxide (ITZO), and an oxide or an alloy thereof may be used alone or in combination, but the present disclosure not limited thereto. In addition, according to an embodiment, the electrode layer 15 may be substantially transparent or translucent. Therefore, light generated in the light emitting element LD may pass through the electrode layer 15 and may be emitted to the outside of the light emitting element LD.

In addition, the light emitting element LD may further include an insulating film 14. However, according to an embodiment of the present disclosure, the insulating film 14 may be omitted or may be provided to cover only a portion of the first semiconductor layer 11, the active layer 12, and the second semiconductor layer 13. For example, the insulating film 14 may be provided at a portion excluding (other than) the both end portions of the light emitting element LD, and thus, the both end portions of the light emitting element LD may be exposed.

For convenience of description, FIGS. 1A and 1B show a state in which a portion of the insulating film 14 is omitted to show the underlying layer, and all sides of an actual light emitting element LD may be surrounded by the insulating film 14.

According to an embodiment of the present disclosure, the insulating film 14 may include a transparent insulating material. For example, the insulating film 14 may include at least one insulating material from among $SiO_2$, $Si_3N_4$, $Al_2O_3$, and $TiO_2$ but is not limited thereto. The insulating film 14 may include various suitable materials having insulating properties.

The insulating film 14 may prevent or substantially prevent an electrical short circuit that may occur when the active layer 12 contacts a conductive material other than the first semiconductor layer 11 and the second semiconductor layer 13 of the same light emitting element LD. In addition, by forming the insulating film 14, a surface defect in the light emitting element LD may be reduced, thereby improving life and efficiency thereof. In addition, when a plurality of light emitting elements LD are closely disposed, the insulating film 14 may prevent an unwanted short circuit that may occur between the light emitting elements LD.

A type, structure, shape, and the like of the light emitting element LD according to embodiments of the present disclosure may be variously changed.

Figure 2A:
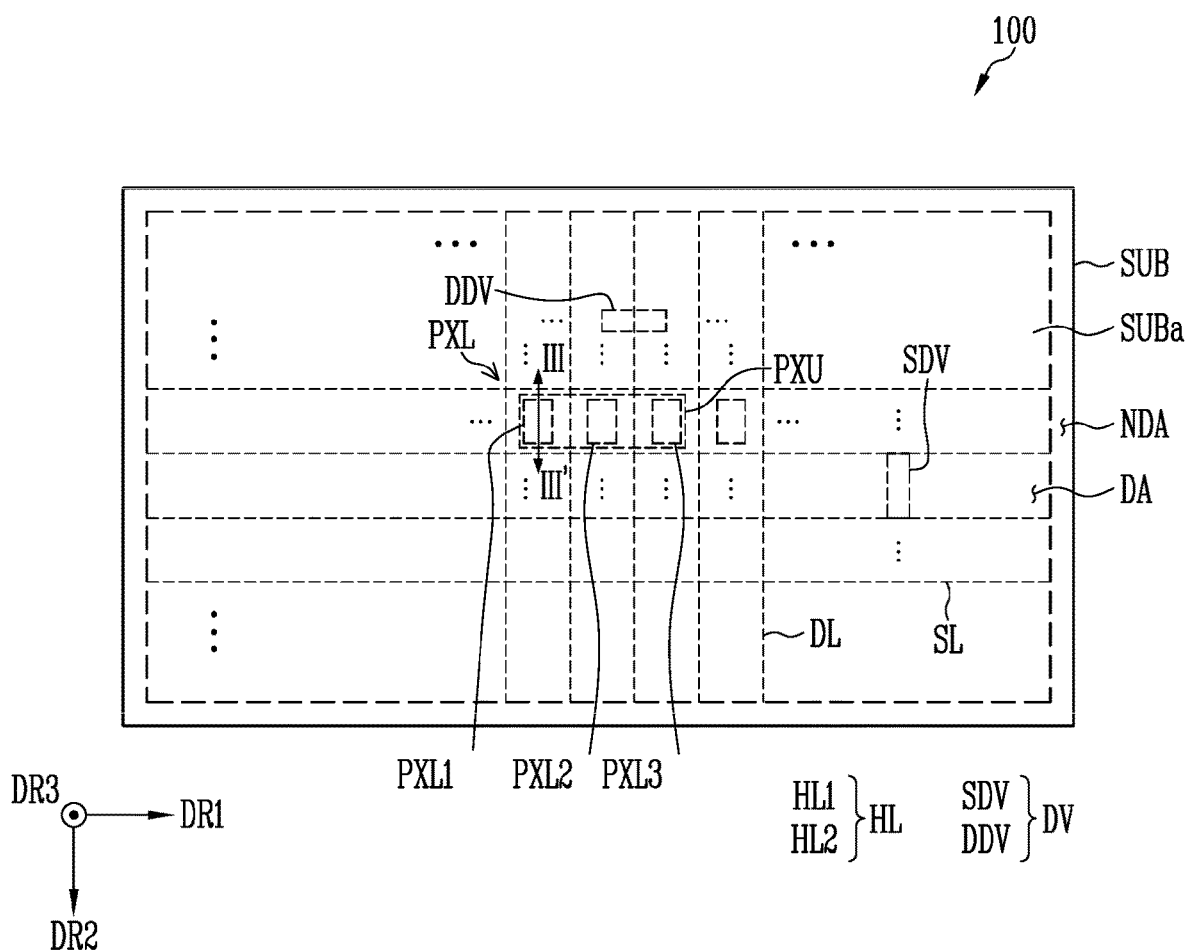
FIG. 2A is a top view illustrating a display device according to an embodiment.
Figure 2B:
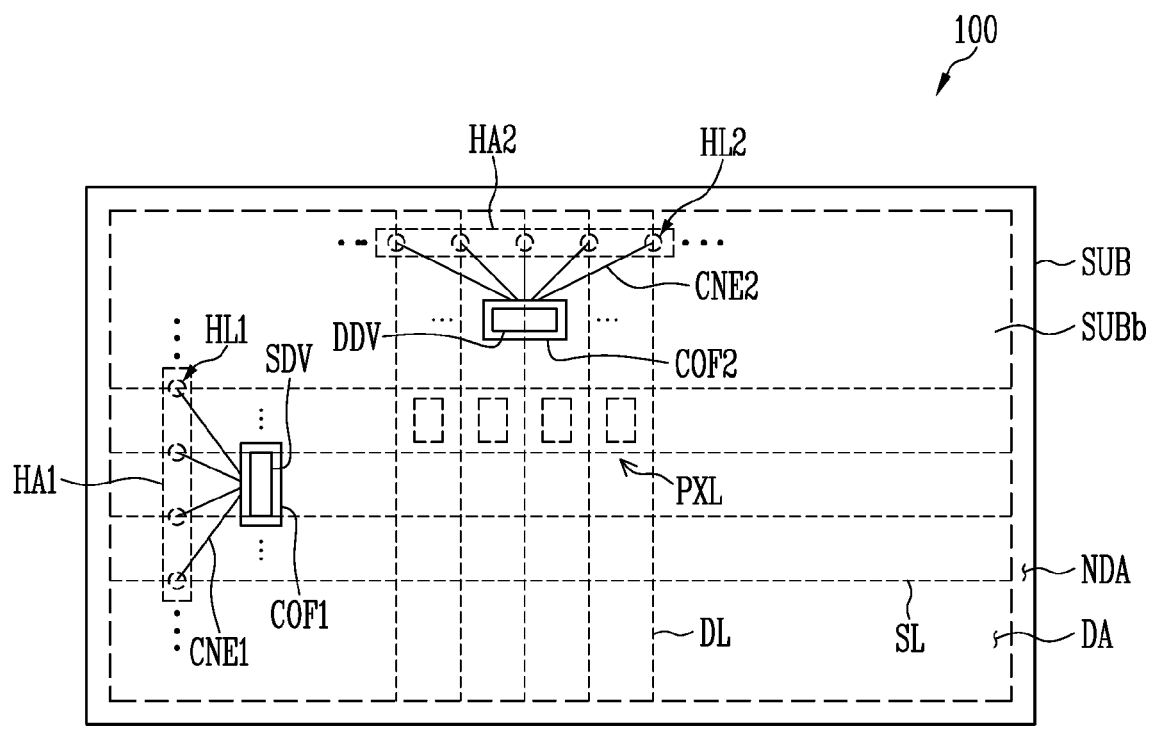
FIG. 2B is a rear view illustrating the display device shown in FIG. 2A.
Figure 3A:
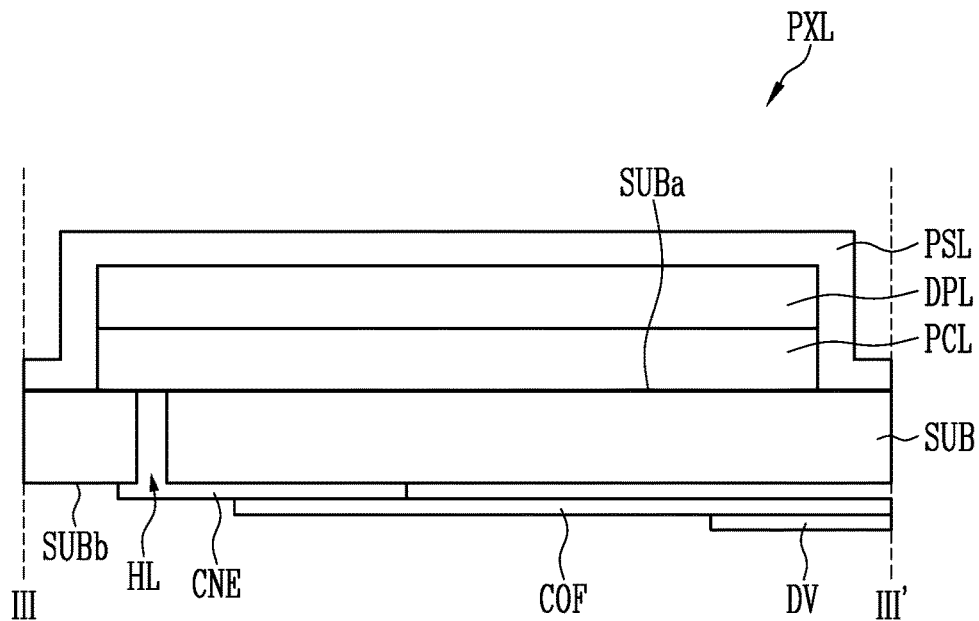
FIGS. 3A and 3B are schematic cross-sectional views of display devices according to embodiments and are cross-sectional views corresponding to the line III-III' of FIG. 2A.
Figure 3B:
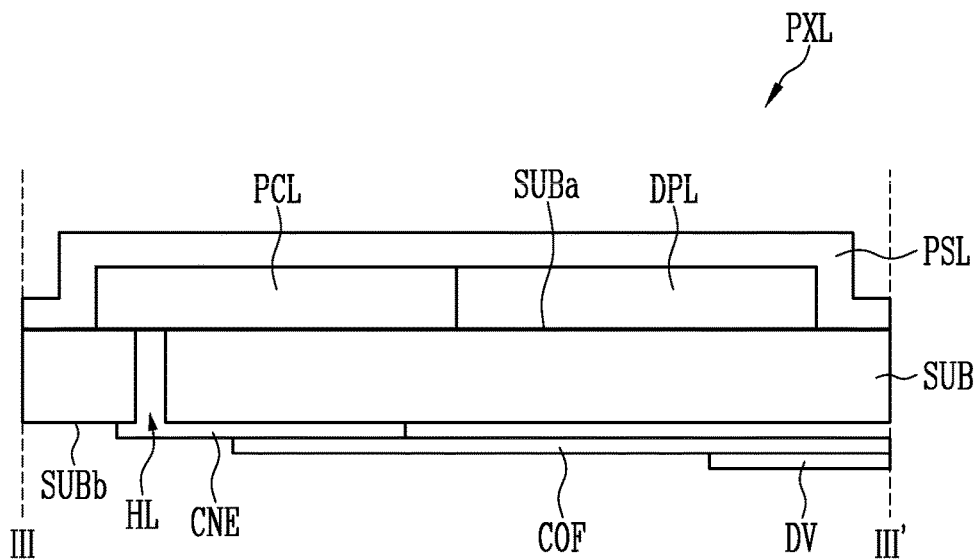

FIG. 2A is a top view illustrating a display device according to an embodiment, and FIG. 2B is a rear view illustrating the display device shown in FIG. 2A. FIGS. 3A and 3B are schematic cross-sectional views of a display device according to embodiments and are cross-sectional views corresponding to the line III-III' of FIG. 2A.

Referring to FIGS. 1A to 3B, the display device (or display panel) 100 may include a substrate SUB and a plurality of pixels PXL provided on an upper surface SUBa of the substrate SUB. In addition, the display device 100 may include a plurality of drivers DV provided on a lower surface SUBb of the substrate SUB.

The display device 100 (or the substrate SUB) may include a display area DA in which the plurality of pixels PXL are disposed to display an image and a non-display area NDA except for (e.g., surrounding or extending around a periphery of) the display area DA. The display device 100 may display the image in the display area DA by driving the pixels PXL corresponding to image data input from the outside.

The display area DA may be an area in which the pixels PXL, the drivers DV, scan lines SL (e.g., first signal lines), and data lines DL (e.g., second signal line) are provided. The display area DA may have various shapes. For example, the display area DA may be provided as a closed polygon shape including a side formed of a straight line, a circle, an ellipse, or the like, including a side formed of a curved line, and a semicircle, a semi-ellipse, or the like, and including a side formed of a straight line and a curved line.

When the display area DA includes a plurality of areas (e.g., when the display area DA is separated into multiple display areas DA), each area may also be provided as various shapes, such as a closed polygon including a side formed of a straight line, a circle, an ellipse, or the like, including a side formed of a curved line, and a semicircle, a semi-ellipse, or the like, and including a side formed of a straight line and a curved line. In addition, when there are the plurality of areas, they may be identical to each other or different from each other. In an embodiment of the present disclosure, an embodiment in which the display area DA is provided as one area having a quadrangle including a straight line side will be described as an example.

The non-display area NDA may be provided on at least one side of the display area DA. In an embodiment of the present disclosure, the non-display area NDA may surround (e.g., may surround or extend around a periphery of) the display area DA. The non-display area NDA may relatively (e.g., extremely) small compared to the size of the display area DA, and in some embodiments, the non-display area NDA may not be provided.

The substrate SUB may have the upper surface SUBa (e.g., the first surface) and the lower surface SUBb (e.g., the second surface) facing the upper surface SUBa. In the following description, describing "is disposed on the upper surface SUBa" may indicate that a component is disposed or formed in a third direction DR3, and describing "is disposed on the lower surface SUBb" may indicate that a component is disposed or formed in an opposite direction of the third direction DR3.

The pixel PXL, the scan lines SL, and the data lines DL may be disposed on the upper surface SUBa of the substrate SUB, and the drivers DV may be disposed on the lower surface SUBb of the substrate SUB.

The substrate SUB may include an opening (e.g., a hole) HL passing through the upper surface SUBa and the lower surface SUBb of the substrate SUB. A connection portion CNE for electrically connecting the pixel PXL and the driver DV to each other may be disposed in (e.g., may extend through) the openings HL in the substrate SUB.

In an embodiment, the openings HL in the substrate SUB may include one or more first openings (e.g., first holes) HL1 and one or more second openings (e.g., second holes) HL2. The first openings HL1 may be formed to respectively overlap the scan lines SL in the third direction DR3, and the second openings HL2 may be formed to overlap the data line DL in the third direction DR3.

A first opening area (e.g., a first hole area) HA1 in which some or all of the first openings HL1 are formed and a second opening area (e.g., a second hole area) HA2 in which some or all of the second openings HL2 are formed may be positioned adjacent to an edge of the substrate SUB but are not limited thereto. For example, at least one of the first opening area HA1 and the second opening area HA2 may be positioned adjacent to a center portion of the substrate SUB.

In addition, the first opening area HA1 may extend in a second direction DR2, and the second opening area HA2 may extend in a first direction DR1, but they are not limited thereto. Each of the first opening area HA1 and the second opening area HA2 may be formed as one area, but they are not limited thereto. In other embodiments, each of the first opening area HA1 and the second opening area HA2 may be formed of a plurality of areas. In such an embodiment, the plurality of opening areas may extend in different directions.

The openings HL may be formed in various suitable shapes, such as a cylindrical shape or a truncated cone shape, and a plurality of openings HL may be formed corresponding to one (e.g., in one-to-one correspondence with) scan line SL or data line DL.

The substrate SUB may be a rigid substrate or a flexible substrate, and a material or a physical property thereof is not particularly limited. For example, the substrate SUB may be a rigid substrate including (or made of) glass or tempered glass, or a flexible substrate including (or made of) a thin film of a plastic or metal material. In addition, the substrate SUB may be a transparent substrate but is not limited thereto. For example, the substrate SUB may be a translucent substrate, an opaque substrate, or a reflective substrate.

For example, the substrate SUB may include (or may be formed of) polyimide (PI), polyethersulfone (PES), polyacrylate (PAC), polyarylate (PAR), polyetherimide (PEI), polyethylene naphthalate (PEN), polyethylene terephthalate (PET), polyphenylene sulfide (PPS), polycarbonate (PC), cellulose triacetate (CTA), cellulose acetate propionate (CAP), or a combination thereof.

As shown in FIG. 2A, the pixels PXL, the scan lines SL, and the data lines DL may be provided in the display area DA of the substrate SUB. In addition, the pixels PXL, the scan lines SL, and the data lines DL may be disposed on the upper surface SUBa of the substrate SUB.

The scan lines SL may extend in the first direction DR1 and may be arranged along (e.g., may be adjacent each other along) the second direction DR2. The data lines DL may extend in the second direction DR2 and may be arranged along (e.g., may be adjacent each other along) the first direction DR1.

Each of the pixels PXL may include one or more light emitting elements (e.g., the light emitting element LD shown in FIG. 1A) connected to the scan lines SL and the data line DL and driven by corresponding scan and data signals. The plurality of pixels PXL may be provided and may be arranged along (e.g., may be adjacent each other along) the first direction DR1 and the second direction DR2 crossing the first direction DR1. However, an arrangement form of the pixels PXL is not particularly limited, and the pixels PXL may be arranged in various suitable forms.

Each of the pixels PXL may emit one of red, green, and blue light but is not limited thereto. For example, each of the pixels PXL may emit one of cyan, magenta, yellow, and white light.

For example, the pixels PXL may include a first sub pixel PXL1 that emits light of a first color, a second sub pixel PXL2 that emits light of a second color different from the first color, and a third sub pixel PXL3 that emits light of a third color different from the first color and the second color. The first sub pixel PXL1, the second sub pixel PXL2, and the third sub pixel PXL3 disposed adjacent to each other may configure one pixel unit PXU configured to emit light of various colors.

In an embodiment, the first sub pixel PXL1 may be a red pixel emitting red light, the second sub pixel PXL2 may be a green pixel emitting green light, and the third sub pixel PXL3 may be a blue pixel emitting blue light. However, a color, type, number, and/or the like of the pixels PXL are/is not particularly limited.

According to an embodiment, the pixels PXL may include light emitting elements LD that emit light of the same color, and the pixels PXL may emit light of different colors by including different color conversion layers (e.g., wavelength conversion layers) disposed on the respective light emitting elements LD. In such an embodiment, the light emitting element LD included in the pixels PXL may be a blue light emitting element but is not limited thereto. In another embodiment, the pixels PXL may include light emitting elements LD that emit light of different colors. For example, the first sub pixel PXL1 may include a red light emitting element, the second sub pixel PXL2 may include a green light emitting element, and the third sub pixel PXL3 may include a blue light-emitting element.

As shown in FIG. 2B, the drivers DV may be disposed on the lower surface SUBb facing the upper surface SUBa of the substrate SUB. The drivers DV may be connected to the connection portion CNE through first and second connection films COF1 and COF2. The drivers DV may provide a signal to each of the pixels PXL through the connection portion CNE formed in the openings HL and on the lower surface SUBb of the substrate SUB, and thus, the drivers DV may control driving of each of the pixels PXL.

The drivers DV may include a scan driver SDV (e.g., a first driver) that provides a scan signal to the pixels PXL through the scan line SL, a data driver DDV (e.g., a second driver) that provides a data signal to the pixels PXL through the data line DL, and a timing controller.

According to an embodiment, the drivers DV may further include an emission control driver that provides an emission control signal to the pixels PXL through an emission control line.

The timing controller may control the scan driver SDV, the data driver DDV, and the emission control driver.

The scan driver SDV may be disposed on one side of the display area DA of the substrate SUB and may be disposed along (e.g., may extend in) one direction (e.g., the second direction DR2). The scan driver SDV may be formed of a plurality of integrated circuit chips (IC chips) and may be attached to the first connection film COF1. The first connection film COF1, to which the scan driver SDV is attached, may be connected to a first connection portions CNE1 to provide the scan signal to the scan lines SL. However, the scan driver SDV is not limited thereto. For example, the scan driver SDV may be directly formed on the lower surface SUBb of the substrate SUB.

The data driver DDV may be disposed on one side of the display area DA of the substrate SUB and may be disposed along (e.g., may extend in) a direction (e.g., the first direction DR1) crossing the direction in which the scan driver SDV is disposed. The data driver DDV may be formed of a plurality of integrated circuit chips (IC chips) and may be attached to the second connection film COF2. The second connection film COF2, to which the data driver DDV is attached, may be connected to a plurality of second connection portions CNE2 to provide the data signal to the data lines DL.

In an embodiment, each of the pixels PXL may be configured as an active type pixel. However, a type, structure, and/or driving method of the pixels PXL that may be applied to the present disclosure are/is not particularly limited.

As shown in FIG. 3A, the pixel PXL may include a pixel circuit layer PCL, a display element layer DPL, and a protective layer PSL.

The pixel circuit layer PCL may be disposed on the upper surface SUBa of the substrate SUB. The pixel circuit layer PCL may include a plurality of circuit elements configuring a driving circuit of the pixel PXL.

The display element layer DPL may be disposed on the pixel circuit layer PCL. The display element layer DPL may include various light emitting elements LD and may emit light in response to a driving signal (e.g., a driving current) provided from the pixel circuit layer PCL.

The protective layer PSL may be disposed on the display element layer DPL and the pixel circuit layer PCL. The protective layer PSL may entirely cover the display element layer DPL and the pixel circuit layer PCL to prevent or substantially prevent the display device 100 from being damaged due to an external foreign substance or the like.

In FIG. 3A, the pixel circuit layer PCL and the display element layer DPL overlap each other the third direction DR3, but a disposition of the pixel circuit layer PCL and the display element layer DPL is not limited thereto. In another embodiment, as shown in FIG. 3B, the display element layer DPL may be disposed on the upper surface SUBa of the substrate SUB (e.g., the display element layer DPL may be adjacent to the pixel circuit layer PCL). For example, the pixel circuit layer PCL and the display element layer DPL may not overlap each other in the third direction DR3.

As shown in FIG. 3A, when the pixel circuit layer PCL and the display element layer DPL are disposed to overlap each other, a disposition density of the pixels PXL may be increased such that this configuration may be advantageous to manufacture the display device 100 having high resolution. On the other hand, as shown in FIG. 3B, when the pixel circuit layer PCL and the display element layer DPL are disposed so as not to overlap each other, at least some of the configurations included in the pixel circuit layer PCL and the display element layer DPL may be simultaneously (or concurrently) formed, a manufacturing cost and a manufacturing time of the display device 100 may be reduced.

Hereinafter, for convenience of description, the pixel circuit layer PCL and the display element layer DPL are separately and specifically described, and both of the pixel circuit layer PCL and the display element layer DPL described below may be applied to configurations shown in FIGS. 3A and 3B.

Figure 4A:
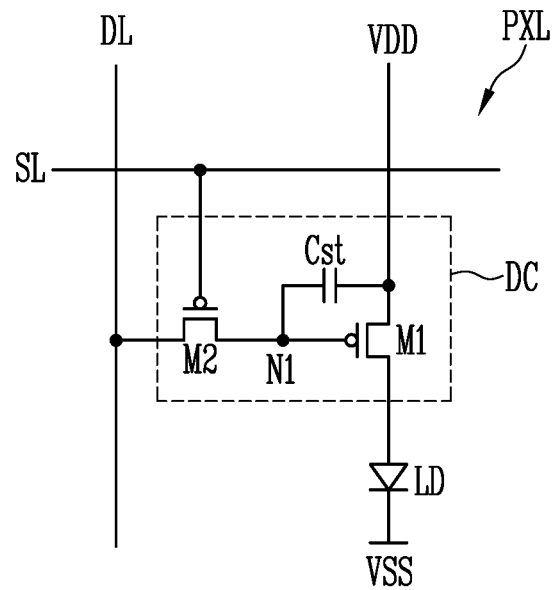
FIGS. 4A to 4C are circuit diagrams illustrating pixels according to embodiments.
Figure 4B:
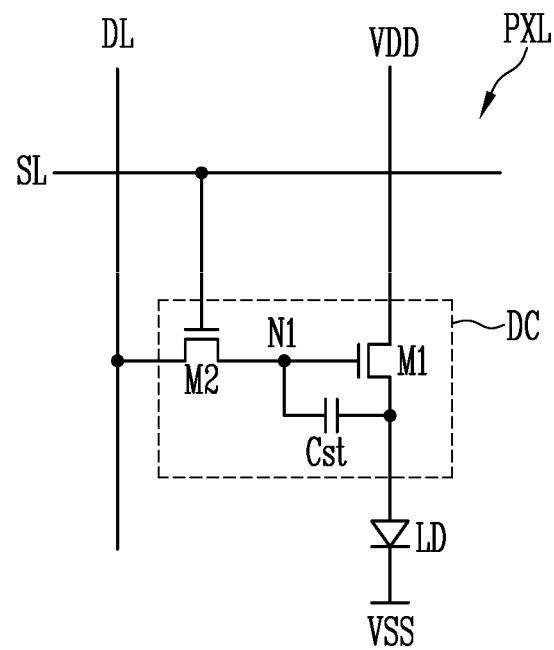
Figure 4C:
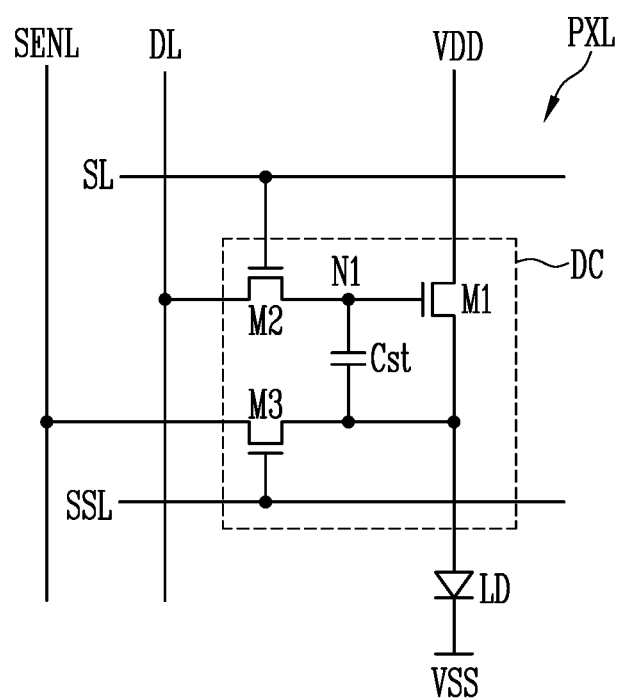

FIGS. 4A to 4C are circuit diagrams illustrating a pixel according to embodiments. In particular, FIGS. 4A to 4C show an example of the pixel configuring an active light emitting display panel.

Referring to FIGS. 1A and 4A, the pixel PXL may include one or more light emitting element LD and a driving circuit DC connected to the light emitting element LD to drive the light emitting element LD.

A first electrode (e.g., an anode electrode) of the light emitting element LD may be connected to a first driving power source VDD through the driving circuit DC, and a second electrode (e.g., a cathode electrode) of the light emitting element LD may be connected to a second driving power source VSS. The light emitting element LD may emit light at a luminance corresponding to a driving current amount controlled by the driving circuit DC.

Although only one light emitting element LD is shown in FIG. 4A, FIG. 4A merely illustrates an exemplary configuration, and the pixel PXL may include a plurality of light emitting elements LD. The plurality of light emitting elements LD may be connected to each other in parallel and/or series.

The first driving power source VDD and the second driving power source VSS may have different potentials. For example, the first driving power source VDD may have a potential equal to or greater than a potential of the second driving power source VSS by a threshold voltage or more of the light emitting element LD. For example, a voltage applied through the first driving power source VDD may be greater than a voltage applied through the second driving power source VSS.

According to an embodiment of the present disclosure, the driving circuit DC may include a first transistor M1, a second transistor M2, and a storage capacitor Cst.

A first electrode of the first transistor M1 (e.g., a driving transistor) may be connected to the first driving power source VDD, and a second electrode of the first transistor M1 may be electrically connected to the first electrode (e.g., the anode electrode) of the light emitting element LD. A gate electrode of the first transistor M1 may be connected to a first node N1. The first transistor M1 may control a driving current amount supplied to the light emitting elements LD corresponding to (or according to) a voltage of the first node N1.

A first electrode of the second transistor M2 (e.g., a switching transistor) may be connected to the data line DL, and a second electrode of the second transistor M2 may be connected to the first node N1. The first electrode and the second electrode of the second transistor M2 may be different electrodes, and for example, when the first electrode is a source electrode, the second electrode may be a drain electrode. A gate electrode of the second transistor M2 may be connected to the scan line SL.

The second transistor M2 may be turned on when a scan signal having a voltage (e.g., a gate on voltage) at which the first transistor M1 may be turned on is supplied from the scan line SL to electrically connect the data line DL and the first node N1 to each other. At this time, a data signal of a corresponding frame may be supplied to the data line DL, and thus, the data signal may be transferred to the first node N1. The data signal transferred to the first node N1 may be stored in the storage capacitor Cst.

One electrode of the storage capacitor Cst may be connected to the first driving power source VDD, and another electrode of the storage capacitor Cst may be connected to the first node N1. The storage capacitor Cst may be charged with a voltage corresponding to the data signal supplied to the first node N1 and may maintain the charged voltage until the data signal of a next frame is supplied.

For convenience of description, FIG. 4A shows a relatively simple driving circuit DC, which includes the second transistor M2 for transferring the data signal into each of the pixel PXL, the storage capacitor Cst for storing the data signal, and the first transistor M1 for supplying the driving current corresponding to the data signal to the light emitting element LD.

However, the present disclosure is not limited thereto, and the structure of the driving circuit DC may be variously changed and implemented. For example, the driving circuit DC may further include other circuit elements, such as various transistors, such as a compensation transistor for compensating for a threshold voltage of the first transistor M1, an initialization transistor for initializing the first node N1, and/or a light emission control transistor for controlling a light emission time of the light emitting element LD, and a boosting capacitor for boosting the voltage of the first node N1.

In addition, in FIG. 4A, all of the transistors included in the driving circuit DC, for example, the first and second transistors M1 and M2, are P-type transistors, but the present disclosure is not limited thereto. For example, at least one of the first and second transistors M1 and M2 included in the driving circuit DC may be changed to an N-type transistor.

For example, as shown in FIG. 4B, the first and second transistors M1 and M2 of the driving circuit DC may be implemented as N-type transistors. The driving circuit DC shown in FIG. 4B may have a configuration or an operation similar to that of the driving circuit DC shown in FIG. 3A except for a connection position change of some components due to the different transistor type. Therefore, detailed description thereof will be omitted.

In addition, as another example, referring to FIG. 4C, the pixel PXL may further include a third transistor M3 (e.g., a sensing transistor).

A gate electrode of the third transistor M3 may be connected to a sensing signal line SSL. One electrode of the third transistor M3 may be connected to a sensing line SENL, and another electrode of the third transistor M3 may be connected to the anode electrode of the light emitting element LD. The third transistor M3 may transfer a voltage value at the anode electrode of the light emitting element LD to the sensing line SENL according to a sensing signal supplied to the sensing signal line SSL during a sensing period. The voltage value transferred through the sensing line SENL may be provided to an external circuit (e.g., the timing controller), and the external circuit may extract characteristic information (e.g., the threshold voltage or the like of the first transistor M1) of the pixel PXL, based on the provided voltage value. The extracted characteristic information may be used to convert (or compensate) image data, such that a characteristic deviation of the pixel PXL is compensated.

Figure 5:
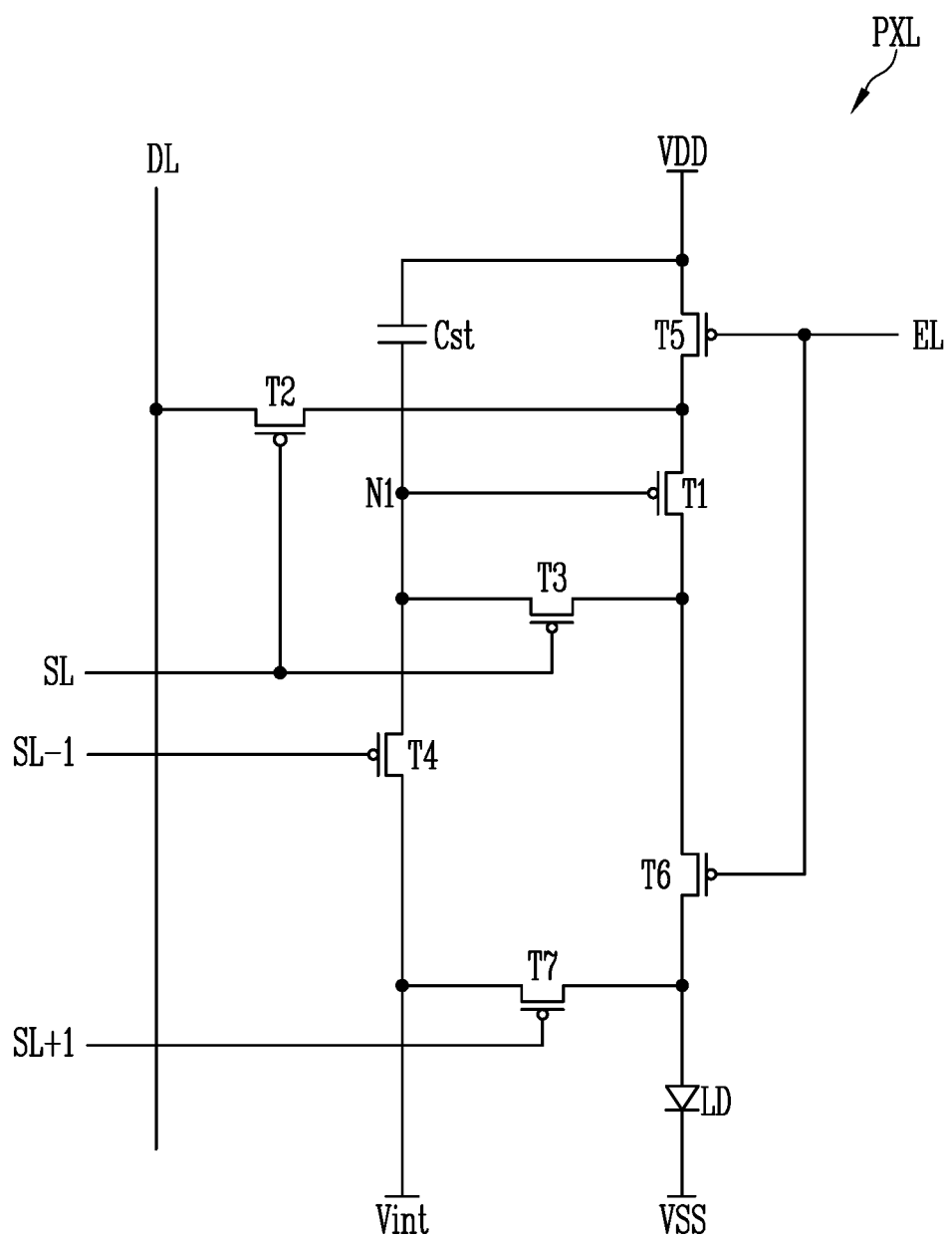
FIG. 5 is a circuit diagram illustrating a pixel according to another embodiment.

FIG. 5 is a circuit diagram illustrating a pixel according to another embodiment.

Referring to FIG. 5, the pixel PXL according to another embodiment of the present disclosure may include a light emitting element LD, first to seventh transistors T1, T2, T3, T4, T5, T6, and T7, and a storage capacitor Cst.

A first electrode (e.g., an anode electrode) of the light emitting element LD may be connected to the first transistor T1 through the sixth transistor T6, and a second electrode (e.g., a cathode electrode) of the light emitting element LD may be connected to the second driving power source VSS. The light emitting element LD may emit light at a luminance (e.g., a predetermined luminance) corresponding to a driving current supplied from the first transistor T1.

One electrode of the first transistor T1 (e.g., the driving transistor) may be connected to the first driving power source VDD through the fifth transistor T5, and another electrode of the first transistor T1 may be connected to the first electrode of the light emitting element LD through the sixth transistor T6. The first transistor T1 may control a current (e.g., a current amount) flowing from the first driving power source VDD to the second driving power source VSS through the light emitting element LD corresponding to (or based on) a voltage at the first node N1, which is a gate electrode of the first transistor T1.

The second transistor T2 (e.g., the switching transistor) may be connected between the data line DL and the one electrode of the first transistor T1. In addition, a gate electrode of the second transistor T2 may be connected to the scan line SL. The second transistor T2 may be turned on when a scan signal having a gate on voltage is supplied to the scan line SL to electrically connect the data line DL and the one electrode of the first transistor T1 to each other.

The third transistor T3 may be connected between the other electrode of the first transistor T1 and the first node N1. In addition, a gate electrode of the third transistor T3 may be connected to the scan line SL. The third transistor T3 may be turned on when the scan signal having the gate on voltage is supplied to the scan line SL to electrically connect the other electrode of the first transistor T1 and the first node N1 to each other.

The fourth transistor T4 may be connected between the first node N1 and initialization power source Vint. In addition, a gate electrode of the fourth transistor T4 may be connected to a scan line SL−1. The fourth transistor T4 may be turned on when a scan signal having the gate on voltage is supplied to the scan line SL−1 to supply a voltage of the initialization power source Vint to the first node N1. In some embodiments, the initialization power source Vint may be set to a voltage lower than that of the data signal. The scan signal supplied to the scan line SL−1 may have the same (or a substantially similar) waveform as the scan signal supplied to the scan line of a previous stage pixel.

The fifth transistor T5 may be connected between the first driving power source VDD and the one electrode of the first transistor T1. A gate electrode of the fifth transistor T5 may be connected to an emission control line EL. The fifth transistor T5 may be turned on when an emission control signal having a gate on voltage is supplied to the emission control line EL, and may be turned off otherwise.

The sixth transistor T6 may be connected between the other electrode of the first transistor T1 and the first electrode of the light emitting element LD. A gate electrode of the sixth transistor T6 may be connected to the emission control line EL. The sixth transistor T6 may be turned on when the light emission control signal having the gate on voltage is supplied to the emission control line EL, and may be turned off otherwise.

The seventh transistor T7 may be connected between the initialization power source Vint and the first electrode of the light emitting element LD. In addition, a gate electrode of the seventh transistor T7 may be connected to a scan line SL+1. The seventh transistor T7 may be turned on when a scan signal having the gate on voltage is supplied to the scan line SL+1 to supply the voltage of the initialization power source Vint to the first electrode of the light emitting element LD. The scan signal supplied to the scan line SL+1 may have the same waveform as the scan signal supplied to the scan line of subsequent stage pixel.

FIG. 5 shows an embodiment in which the gate electrode of the seventh transistor T7 is connected to the scan line SL+1. However, the present disclosure is not limited thereto. For example, in another embodiment of the present disclosure, the gate electrode of the seventh transistor T7 may be connected to the scan line SL or the scan line SL−1. In such embodiments, the voltage of the initialization power source Vint may be supplied to the anode electrode of the light emitting element LD through the seventh transistor T7 when the scan signal having the gate on voltage is supplied to the scan line SL or the scan line SL−1.

The storage capacitor Cst may be connected between the first driving power source VDD and the first node N1. The storage capacitor Cst may store a voltage corresponding to the data signal and the threshold voltage of the first transistor T1.

In the embodiment shown in FIG. 5, all of the transistors included in the driving circuit DC, for example, the first to seventh transistors T1, T2, T3, T4, T5, T6, and T7, are P-type transistors, however, the present disclosure is not limited thereto. For example, at least one of the first to seventh transistors T1, T2, T3, T4, T5, T6, and T7 may be changed to an N-type transistor.

Figure 6:
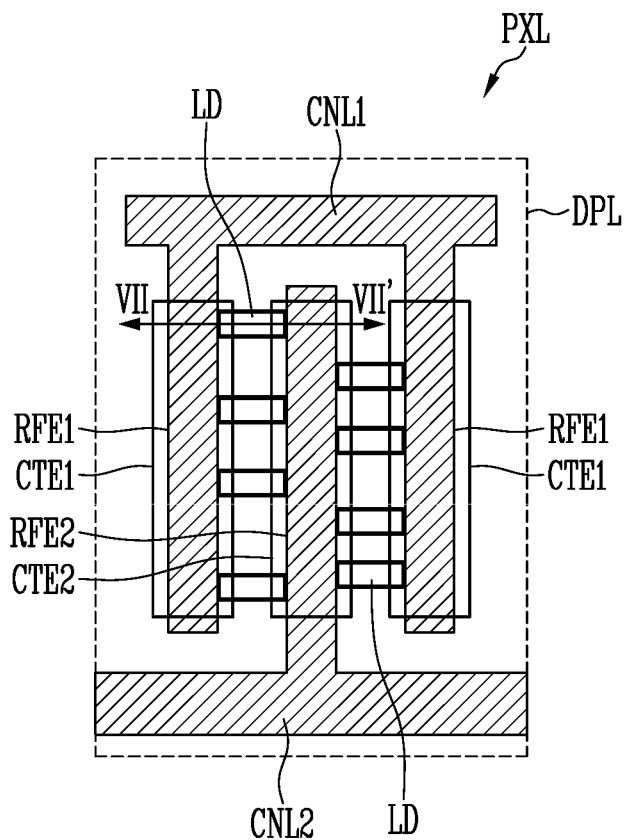
FIG. 6 is a plan view illustrating an example of a display element layer included in the pixel shown in FIG. 3A.
Figure 6:
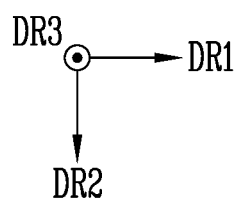
Figure 7:
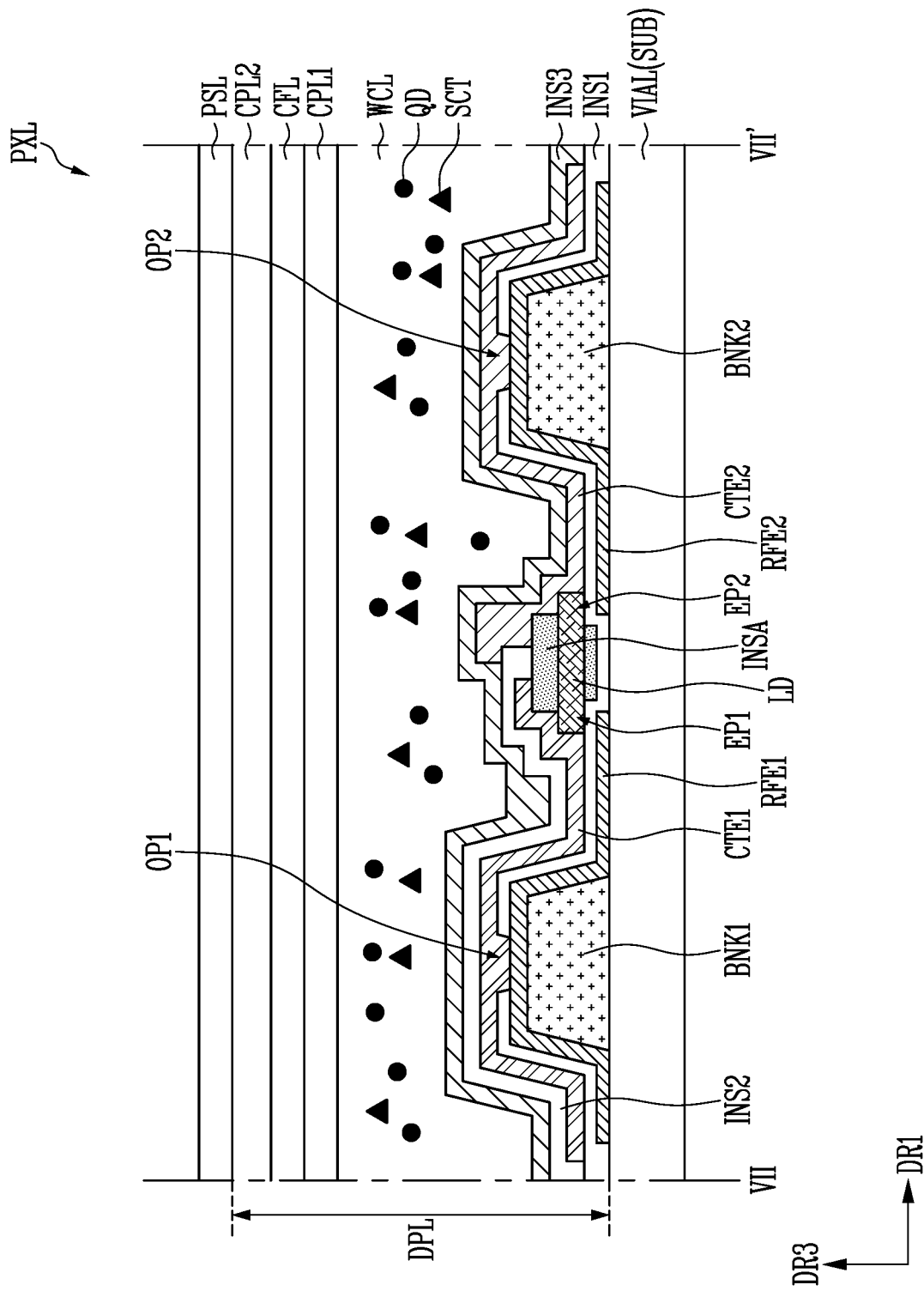
FIG. 7 is a cross-sectional view of the display element layer taken along the line VII-VII' of FIG. 6.

FIG. 6 is a plan view illustrating an example of the display element layer included in the pixel shown in FIG. 3A, and FIG. 7 is a cross-sectional view of the display element layer taken along the line VII-VII' of FIG. 6.

Referring to FIGS. 3A, 6, and 7, the display device layer DPL according to an embodiment of the present disclosure may include a first electrode RFE1, a second electrode RFE2, a first insulating layer INS1, and the light emitting element LD. The display element layer DPL may further include a first bank BNK1, a second bank BNK2, a fix layer (e.g., a fixing layer) INSA, a third electrode CTE1, a fourth electrode CTE2, a second insulating layer INS2, a third insulating layer INS3, a wavelength conversion layer WCL, a first capping layer CPL1, a color filter layer CFL, and a second capping layer CPL2.

When the display element layer DPL is disposed on the pixel circuit layer PCL (see, e.g., FIG. 3A), the display element layer DPL may be disposed on a via layer VIAL (e.g., a base layer). The via layer VIAL may be an insulating layer disposed on the uppermost layer of the pixel circuit layer PCL or may correspond to the uppermost layer of the pixel circuit layer PCL. As shown in FIG. 3B, when the display element layer DPL is not disposed on the pixel circuit layer PCL, the display element layer DPL may be directly disposed on the upper surface SUBa of the substrate SUB.

Hereinafter, for convenience of description, the embodiment in which the display element layer DPL is disposed on the pixel circuit layer PCL will be described in detail, but the present disclosure is not limited thereto.

The first bank BNK1 and the second bank BNK2 may be disposed on the via layer VIAL. A space in which the light emitting element LD is disposed may be provided between the first bank BNK1 and the second bank BNK2. In an embodiment, the first bank BNK1 and the second bank BNK2 may be spaced apart along the first direction DR1 on the via layer VIAL by a distance equal to or greater than the length of the light emitting element LD. The first bank BNK1 and the second bank BNK2 may be disposed on the same layer and may have the same (or substantially the same) height but are not limited thereto. In addition, the first bank BNK1 and the second bank BNK2 may extend along the second direction DR2 crossing the first direction DR1.

The first bank BNK1 and the second bank BNK2 may include (or may be) an insulating material including an organic material or an inorganic material, but the material of the first bank BNK1 and the second bank BNK2 is not limited thereto. In addition, the first bank BNK1 and the second bank BNK2 may be formed of a single layer but are not limited thereto, and may include (or may be formed of) multiple layers. When the first bank BNK1 and the second bank BNK2 include multiple layers, they may include at least one organic insulating film and at least one inorganic insulating film are stacked on each other.

In addition, the cross-sectional shape of each of the first bank BNK1 and the second bank BNK2 may be a trapezoidal shape in which a side surface is inclined at an angle (e.g., a predetermined angle), but the cross-sectional shape of the first bank BNK1 and the second bank BNK2 is not limited thereto. In other embodiments, the first bank BNK1 and the second bank BNK2 may have various cross-sectional shapes, such as a semi-elliptical shape, a circular shape, and a quadrangular shape.

The first electrode RFE1 and the second electrode RFE2 may be disposed on the first bank BNK1 and the second bank BNK2, respectively. For example, the first electrode RFE1 may be provided on the first bank BNK1, and the second electrode RFE2 may be provided on the second bank BNK2.

In addition, the first electrode RFE1 and the second electrode RFE2 may be disposed to be spaced apart from each other. The first electrode RFE1 and the second electrode RFE2 may be spaced apart from each other by a distance (e.g., a predetermined distance) along the first direction DR1. A distance at which the first electrode RFE1 and the second electrode RFE2 are spaced apart from each other may be less than the length of the light emitting element LD. Accordingly, when the light emitting element LD is disposed at a center portion between the first electrode RFE1 and the second electrode RFE2, at least a portion of the first electrode RFE1 and at least a portion of the second electrode RFE2 may overlap the light emitting elements LD in the third direction DR3. The first electrode RFE1 and the second electrode RFE2 may extend along the second direction DR2 on a plane.

The first electrode RFE1 may be connected to a first connection line CNL1, and the second electrode RFE2 may be connected to a second connection line CNL2. According to an embodiment, the first connection line CNL1 may be provided integrally with (e.g., may be integrally formed with) the first electrode RFE1, and the second connection line CNL2 may be provided integrally with (e.g., may be integrally formed with) the second electrode RFE2.

The first electrode RFE1 and the second electrode RFE2 may be disposed to have a substantially uniform thickness along a surface of the first bank BNK1 and the second bank BNK2. The first electrode RFE1 and the second electrode RFE2 may correspond to a shape of the first bank BNK1 and the second bank BNK2. For example, the first electrode RFE1 may have a shape corresponding to the inclination of the first bank BNK1, and the second electrode RFE2 may have a shape corresponding to the inclination of the second bank BNK2.

The first electrode RFE1 and the second electrode RFE2 may include (or may be formed of) a conductive material. For example, each of the first electrode RFE1 and the second electrode RFE2 may include metal, such as Al, Mg, Ag, Pt, Pd, Au, Ni, Nd, Ir, Cr, Ti, or an alloy thereof. Each of the first electrode RFE1 and the second electrode RFE2 may include (or may further include) a transparent conductive material, such as indium tin oxide (ITO), indium zinc oxide (IZO), zinc oxide (ZnO), and indium tin zinc oxide (ITZO).

The first electrode RFE1 and the second electrode RFE2 are not limited to the above-described materials. For example, the first electrode RFE1 and the second electrode RFE2 may include a conductive material having a constant reflectance. When the first electrode RFE1 and the second electrode RFE2 are formed of the conductive material having the constant reflectance, light emitted from a first end portion EP1 and a second end portion EP2 of the light emitting element LD may be reflected by the first electrode RFE1 and the second electrode RFE2 and may progress in (e.g., may travel in) a display direction (e.g., the third direction DR3).

For example, the first electrode RFE1 and the second electrode RFE2 may have a shape corresponding to the shape of the first bank BNK1 and the second bank BNK2 and may have an inclined surface inclined with respect to the via layer VIAL (or the substrate (SUB)). The light emitted from the first end portion EP1 and the second end portion EP2 of each of the light emitting elements LD may be reflected by the first electrode RFE1 and the second electrode RFE2 and may further progress in the third direction DR3. Therefore, light output efficiency of the display device may be improved.

One of the first electrode RFE1 and the second electrode RFE2 may be an anode, and the other of the first electrode RFE1 and the second electrode RFE2 may be a cathode. For example, the first electrode RFE1 may be the anode, and the second electrode RFE2 may be the cathode. However, the present disclosure is not limited thereto.

The first electrode RFE1 and the second electrode RFE2 may provide a driving signal to the light emitting element LD, and the light emitting element LD may emit light corresponding to the provided driving signal.

The first electrode RFE1 and the second electrode RFE2 may be disposed on the same plane as each other and may have the same (or substantially the same) thickness. In addition, the first electrode RFE1 and the second electrode RFE2 may be simultaneously (or currently) formed in the same process.

The first connection line CNL1 and the second connection line CNL2 may be electrically connected to the pixel circuit layer PCL through a contact opening (e.g., a contact hole) or a separate connection member. The first connection line CNL1 and the second connection line CNL2 may transfer the driving signal to the first electrode RFE1 and the second electrode RFE2, respectively. The light emitting element LD may emit light corresponding to the driving signal applied to the first electrode RFE1 and the second electrode RFE2 through the first connection line CNL1 and the second connection line CNL2.

Each of the first electrode RFE1 and the second electrode RFE2 may be electrically connected to any one of the driving circuit DC and the second driving power source VSS through a separate connection line or connection member (see, e.g., FIG. 4A). For example, the first electrode RFE1 may be electrically connected to the driving circuit DC, and the second electrode RFE2 may be electrically connected to the second driving power source VSS. However, a connection relationship between the first electrode RFE1 and the second electrode RFE2 is not limited to the above.

The first electrode RFE1 and the second electrode RFE2 may be electrically connected to the first end portion EP1 and the second end portion EP2 of the light emitting element LD, respectively, to provide the driving signal to the light emitting element LD. The light emitting element LD may emit light having a luminance (e.g., having a predetermined luminance) corresponding to the driving current provided from the driving circuit DC.

The first insulating layer INS1 may be provided on the first electrode RFE1 and the second electrode RFE2. The first insulating layer INS1 may be entirely provided on the via layer VIAL to cover the first bank BNK1, the second bank BNK2, the first electrode RFE1, and the second electrode RFE2. In addition, the first insulating layer INS1 may be disposed along a surface of the via layer VIAL at where the first bank BNK1, the second bank BNK2, the first electrode RFE1 and the second electrode RFE2 are not disposed.

In an embodiment, the first insulating layer INS1 may be an inorganic insulating layer including (or formed of) an inorganic material. In such an embodiment, the first insulating layer INS1 may be disposed to have a substantially uniform thickness along the surface of the via layer VIAL, the first electrode RFE1, and the second electrode RFE2.

The first insulating layer INS1 may include a first opening OP1 and a second opening OP2. The first opening OP1 and the second opening OP2 may respectively expose at least a portion of the first electrode RFE1 and the second electrode RFE2.

The first opening OP1 and the second opening OP2 may be formed to overlap the respective corresponding first electrode RFE1 and second electrode RFE2. For example, the first opening OP1 may be formed to overlap the first electrode RFE1, and the second opening OP2 may be formed to overlap the second electrode RFE2.

The first opening OP1 and the second opening OP2 may have a thickness and/or a depth corresponding to a thickness of the first insulating layer INS1. For example, the first opening OP1 and the second opening OP2 may completely pass through the first insulating layer INS1 in the corresponding region. Accordingly, a portion of the first electrode RFE1 and the second electrode RFE2 may be exposed through the first insulating layer INS1 to contact a third electrode CTE1 and a fourth electrode CTE2, which will be described in more detail below.

The light emitting element LD may be disposed on the first insulating layer INS1. The light emitting element LD may be disposed in the space provided between the first bank BNK1 and the second bank BNK2. In a plan view, the light emitting element LD may be disposed between the first electrode RFE1 and the second electrode RFE2.

The fix layer INSA, for stably supporting and fixing the light emitting element LD, may be disposed on the light emitting element LD. The fix layer INSA may be an inorganic insulating film including an inorganic material or an organic insulating film including an organic material. The fix layer INSA may cover at least a portion of an outer circumferential surface of each of the light emitting elements LD and may be formed to expose the first end portion EP1 and the second end portion EP2 of the light emitting element LD. Accordingly, the fix layer INSA may prevent (or substantially prevent) the light emitting element LD from separating from the substrate SUB. According to an embodiment, the fix layer INSA may be disposed to fill a space between the light emitting element LD and the first insulating layer INS1. The fix layer INSA may be omitted according to process condition or the like of the display device.

The third electrode CTE1 (e.g., a first contact electrode) and the fourth electrode CTE2 (e.g., a second contact electrode) may be provided on the first insulating layer INS1, the light emitting element LD, and the fix layer INSA. In addition, the second insulating layer INS2 may be provided between the third electrode CTE1 and the fourth electrode CTE2.

The third electrode CTE1 and the fourth electrode CTE2 may respectively contact the end portions EP1 and EP2 of each light emitting element LD. For example, the third electrode CTE1 may contact the first end portion EP1 of each light emitting element LD, and the fourth electrode CTE2 may contact the second end portion EP2 of each light emitting element LD.

In a plan view, the third electrode CTE1 may cover at least a portion of the first electrode RFE1. The third electrode CTE1 may be electrically connected to the first electrode RFE1 through the first opening OP1 in the first insulating layer INS1. For example, the third electrode CTE1 may contact the first end portion EP1 of the light emitting element LD and the first electrode RFE1.

In a plan view, the fourth electrode CTE2 may cover at least a portion of the second electrode RFE2. The fourth electrode CTE2 may be electrically connected to the second electrode RFE2 through the second opening OP2 in the first insulating layer INS1. For example, the fourth electrode CTE2 may contact the second end portion EP2 of the light emitting element LD and the second electrode RFE2.

Each of the third electrode CTE1 and the fourth electrode CTE2 may include (or may be formed or configured of) a transparent conductive material. For example, the transparent conductive material may include ITO, IZO, ITZO, and the like. When the third electrode CTE1 and the fourth electrode CTE2 are configured of the transparent conductive material, light loss may be reduced when the light emitted from the light emitting element LD progresses in the third direction DR3. However, the third electrode CTE1 and the fourth electrode CTE2 are not limited to the materials described above.

The second insulating layer INS2 may be disposed between the third electrode CTE1 and the fourth electrode CTE2. For example, the second insulating layer INS2 may include an inorganic insulating film including (or formed of) an inorganic material. The second insulating layer INS2 may be disposed to cover one of the third electrode CTE1 and the fourth electrode CTE2, and the other one of the third electrode CTE1 and the fourth electrode CTE2 may be disposed on the second insulating layer INS2. For example, the second insulating layer INS2 may be disposed on the third electrode CTE1 to cover the third electrode CTE1, and the fourth electrode CTE2 may be disposed on the second insulating layer INS2. For example, the third electrode CTE1 and the fourth electrode CTE2 may be electrically separated by the second insulating layer INS2.

However, the disposition of the third electrode CTE1 and the fourth electrode CTE2 is not limited thereto. For example, the third electrode CTE1 and the fourth electrode CTE2 may be disposed on the same layer. In such an embodiment, the third electrode CTE1 and the fourth electrode CTE2 may be simultaneously (or concurrently) formed, and the second insulating layer INS2 (e.g., the formation of the second insulating layer INS2) may be omitted. Accordingly, a manufacturing process of the display device may be simplified and a manufacturing cost of the display device may be reduced.

The third insulating layer INS3 may be disposed on the third electrode CTE1, the fourth electrode CTE2, and the second insulating layer INS2. The third insulating layer INS3 may also be an encapsulation layer that prevents (or substantially prevents) the third electrode CTE1, the fourth electrode CTE2, and the light emitting element LD from being damaged during the manufacturing process of the display device and prevents (or substantially prevents) oxygen and/or moisture from penetrating therethrough.

The third insulating layer INS3 may be formed of an inorganic insulating film including an inorganic material. The third insulating layer INS3 may be formed as a single layer but is not limited thereto and may have a multi-layer structure. When the third insulating layer INS3 has the multi-layer structure, the third insulating layer INS3 may further include an organic insulating film including an organic material alternatively disposed with the inorganic insulating film.

The wavelength conversion layer WCL may be disposed on the third insulating layer INS3. The wavelength conversion layer WCL may include a wavelength conversion particle QD and a scattering particle SCT. The wavelength conversion layer WCL is not particularly limited as long as the wavelength conversion layer WCL has a material having a high light transmittance and excellent dispersion properties for the wavelength conversion particle QD and the scattering particle SCT. For example, the wavelength conversion layer WCL may include an organic material, such as an epoxy-based resin, an acrylic-based resin, a cardo-based resin, or an imide-based resin.

The wavelength conversion particle QD may convert a peak wavelength of incident light to another specific peak wavelength. For example, the wavelength converting particle QD may convert a color of the incident light to another color.

For example, when the light emitting element LD emits blue light, the wavelength conversion particle QD may convert the blue light emitted by the light emitting element LD into light of a different color and emit the different color light. For example, the wavelength converting particle QD may convert the blue light provided from the light emitting element LD into red light or green light and emit the red light or the green light.

An example of the wavelength conversion particle QD may include a quantum dot, a quantum rod, a phosphor, and the like. The quantum dot may be a particulate material that emits light having a specific wavelength as an electron transits from a conduction band to a valence band. Hereinafter, the wavelength conversion particle QD is described as being a quantum dot, but the present disclosure is not limited thereto.

The quantum dot may be a semiconductor nanocrystalline material. The quantum dot may have a specific band gap according to its composition and size and may absorb incident light and then emit light having a unique wavelength. An example of the semiconductor nanocrystal of the quantum dot may include a group IV nanocrystal, a group II-VI compound nanocrystal, a group III-V compound nanocrystal, a group IV-VI nanocrystal, or a combination thereof.

For example, an example of the group IV nanocrystal may include silicon (Si), germanium (Ge), a binary compound, such as silicon carbide (SiC) or silicon-germanium (SiGe), or the like, but the present disclosure is not limited thereto.

In addition, an example of the group II-VI compound nanocrystal may include a binary compound, such as CdSe, CdTe, ZnS, ZnSe, ZnTe, ZnO, HgS, HgSe, HgTe, MgSe, MgS, and a mixture thereof, a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, or a quaternary compound, such as HgZnTeS, CdZnSeS, CdZnSeTe, CdZnSTe, CdHgSeS, CdHgSeTe, CdHgSTe, HgZnSeS, HgZnSeTe, HgZnSTe and a mixture thereof, but the present disclosure is not limited thereto.

In addition, an example of the group III-V compound nanocrystal may include a binary compound, such as GaN, GaP, GaAs, GaSb, AlN, AlP, AlAs, AlSb, InN, InP, InAs, InSb, and a mixture thereof, a ternary compound, such as GaNP, GaNAs, GaNSb, GaPAs, GaPSb, AlNP, AlNAs, AlNSb, AlPAs, AlPSb, InGaP, InNP, InNAs, InNSb, InPAs, InPSb, and a mixture thereof, or a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but the present disclosure is not limited thereto.

An example of the group IV-VI nanocrystal may include a binary compound, such as SnS, SnSe, SnTe, PbS, PbSe, PbTe, and a mixture thereof, a ternary compound, such as SnSeS, SnSeTe, SnSTe, PbSeS, PbSeTe, PbSTe, SnPbS, SnPbSe, SnPbTe, and a mixture thereof, or a quaternary compound, such as SnPbSSe, SnPbSeTe, SnPbSTe, and a mixture thereof, but the present disclosure is not limited thereto.

A shape of the quantum dot is a shape generally used in the art and is not particularly limited. However, for example, the quantum dot may be a spherical, pyramidal, multi-arm, or cubic nanoparticle, nanotube, nanowire, nanofiber, nanoplate-like particle, and the like. The above-described binary compound, ternary compound, or quaternary compound may be present in a particle at a uniform concentration or may be present in the same particle by being divided into states in which concentration distributions are partially different.

The quantum dot may have a core-shell structure including a core including the nanocrystal described above and a shell surrounding the core. An interface between the core and the shell may have a concentration gradient in which a concentration of an element present in the shell decreases toward a center. The shell of the quantum dot may serve as a protective layer for maintaining semiconductor properties by preventing (or substantially preventing) chemical modification of the core and/or a charging layer for imparting electrophoretic properties to the quantum dot. The shell may be a single layer or may include multiple layers. An example of the shell of the quantum dot may include an oxide of metal or nonmetal, a semiconductor compound, or a combination thereof.

For example, an example of the oxide of metal or nonmetal may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound, such as $MgAl_2O_4$, $CoFe_2O_4$, $NiFe_2O_4$, or $CoMn_2O_4$, but the present disclosure is not limited thereto.

In addition, an example of the semiconductor compound may include CdS, CdSe, CdTe, ZnS, ZnSe, ZnTe, ZnSeS, GaAs, GaP, GaSb, HgS, HgSe, HgTe, InAs, InP, InSb, AlAs, AlP, AlSb, and the like, but the present disclosure is not limited thereto.

A full width at half maximum (FWHM) of the light emission wavelength spectrum of the light emitted by the quantum dot described above may be about 45 nm or less, thereby improving color purity and color reproducibility of a color displayed by the display device. In addition, the light emitted by the quantum dot may be emitted toward various directions regardless of an incident direction of the incident light. Therefore, side visibility of the display device may be improved.

The scattering particle SCT may have a refractive index different from that of the wavelength conversion layer WCL and may form an optical interface with the wavelength conversion layer WCL. The scattering particle SCT is not particularly limited as long as the scattering particle SCT includes (or is) a material capable of scattering at least some of the incident light. For example, the scattering particle SCT may be a particle including (or formed of) a material, such as titanium oxide ($TiO_2$), aluminum oxide ($Al_2O_3$), indium oxide ($In_2O_3$), zinc oxide (ZnO), tin oxide ($SnO_2$), or silica.

The scattering particle SCT may scatter light in random directions regardless of an incident direction of incident light without substantially converting a wavelength of light passing through the wavelength conversion layer WCL. Therefore, side visibility of the display device may be improved.

The first capping layer CPL1 may be disposed on the wavelength conversion layer WCL. The first capping layer CPL1 may be an inorganic insulating layer including (or formed of) an inorganic material. The first capping layer CPL1 may entirely cover the wavelength conversion layer WCL and serve as an encapsulation layer preventing (or substantially preventing) oxygen and/or moisture from penetrating into the wavelength conversion layer WCL from the outside. Accordingly, the wavelength conversion layer WCL may be encapsulated by the third insulating layer INS3 and the first capping layer CPL1.

The color filter layer CFL may be disposed on the first capping layer CPL1. The color filter layer CFL may be an absorption type filter configured to selectively transmit light having a specific color while absorbing light having another color to block progression (e.g., to block emission).

The second capping layer CPL2 may be disposed on the color filter layer CFL. The second capping layer CPL2 may be an inorganic insulating layer including (or formed of) an inorganic material. The second capping layer CPL2 may entirely cover the color filter layer CFL and act as an encapsulation layer preventing (or substantially preventing) oxygen and/or moisture from penetrating into the color filter layer CFL from the outside. Accordingly, the color filter layer CFL may be encapsulated by the first capping layer CPL1 and the second capping layer CPL2.

In some embodiments, the color filter layer CFL and the second capping layer CPL2 may be omitted.

The protective layer PSL may be disposed on the display element layer DPL. The protective layer PSL may be an inorganic insulating layer including (or formed of) an inorganic material. The protective layer PSL may entirely cover the display element layer DPL and the pixel circuit layer PCL (see, e.g., FIG. 3A) to prevent (or substantially prevent) the display element layer DPL and the pixel circuit layer PCL from being damaged due to an external foreign substance or the like. The protective layer PSL may further cover the upper surface SUBa of the substrate SUB on which the pixel PXL is not disposed and which is otherwise exposed to the outside.

The display element layer DPL may further include a partition wall disposed to surround (e.g., to surround or extend around a periphery of) the pixel PXL. The partition wall may be a pixel defining film defining a light emission area of the pixel PXL. The partition wall may include a light blocking material and/or a reflective material to prevent (or substantially prevent) the occurrence of a light leakage defect in which light is leaked between adjacent pixels.

In addition, during a process of aligning the light emitting element LD, the partition wall may prevent (or substantially prevent) a solution including the light emitting element LD from leaking into an adjacent pixel. In addition, during a process of forming the wavelength conversion layer WCL, the partition wall may prevent (or substantially prevent) a solution including the wavelength conversion particle QD from leaking into an adjacent pixel. The partition wall may be omitted according to process condition of the display device.

Figure 8:
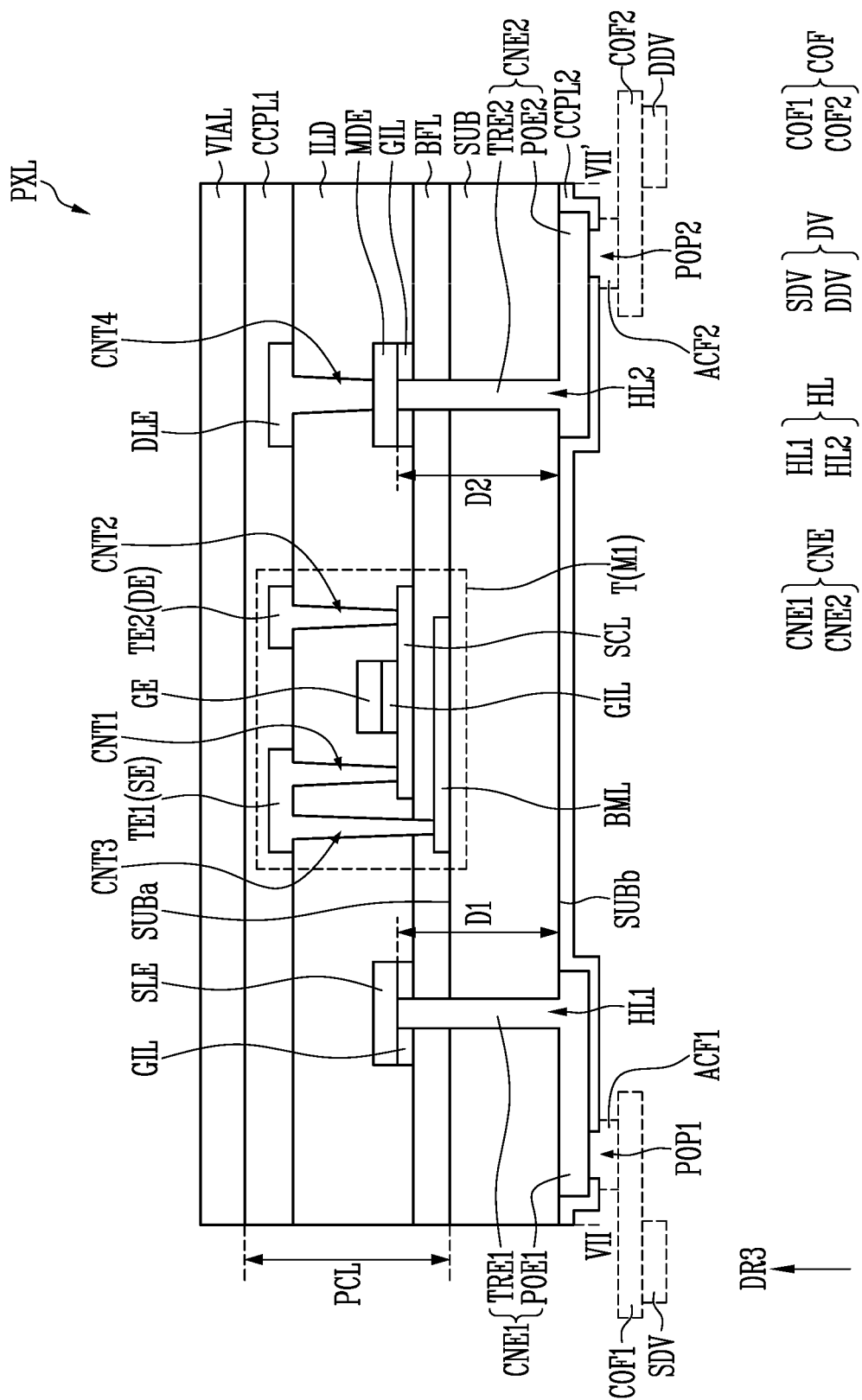
FIG. 8 is a cross-sectional view illustrating an embodiment in which a pixel circuit layer and a driver are electrically connected to each other.
Figure 9:
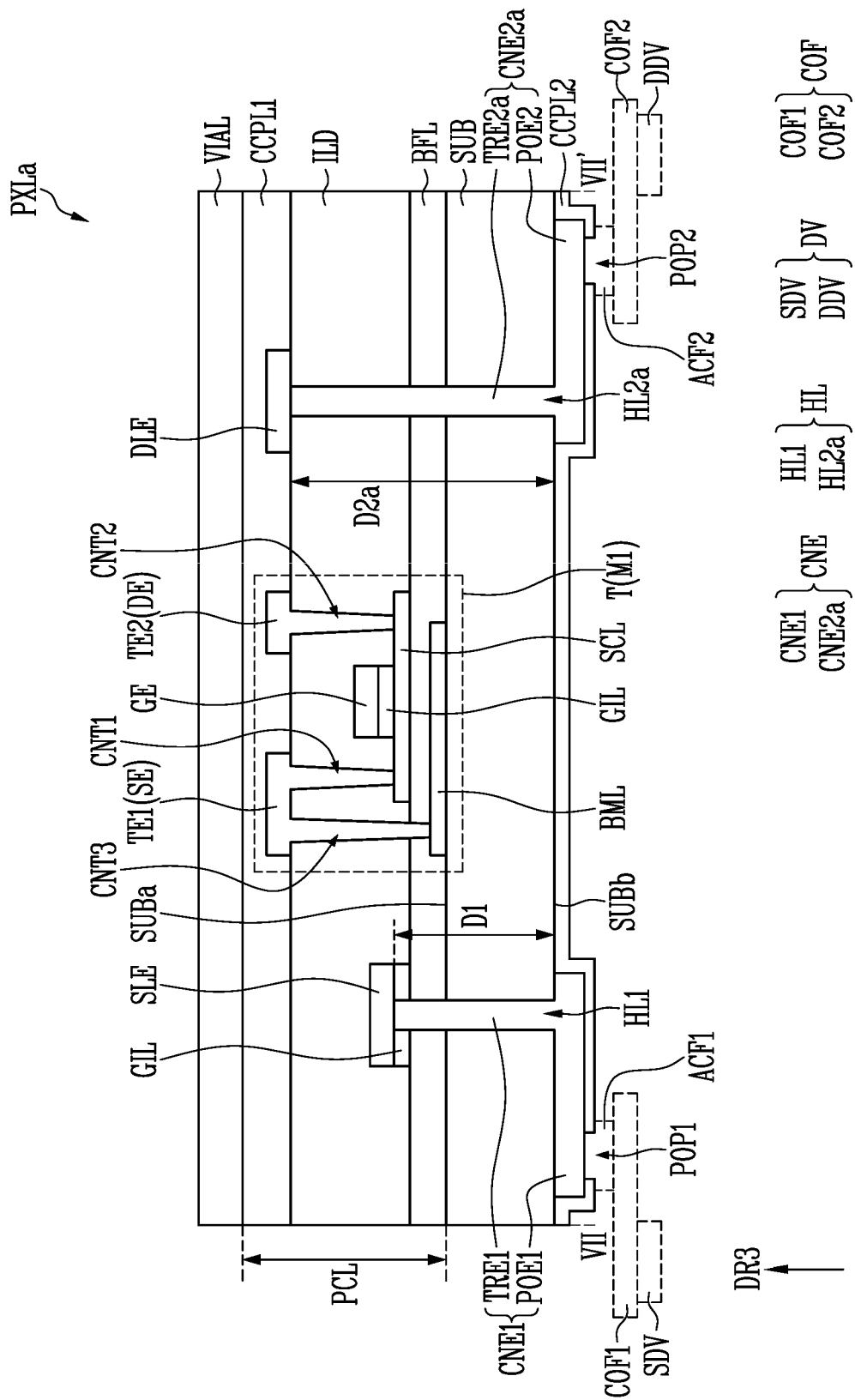
FIG. 9 is a cross-sectional view illustrating another embodiment in which a pixel circuit layer and a driver are electrically connected to each other.
Figure 10:
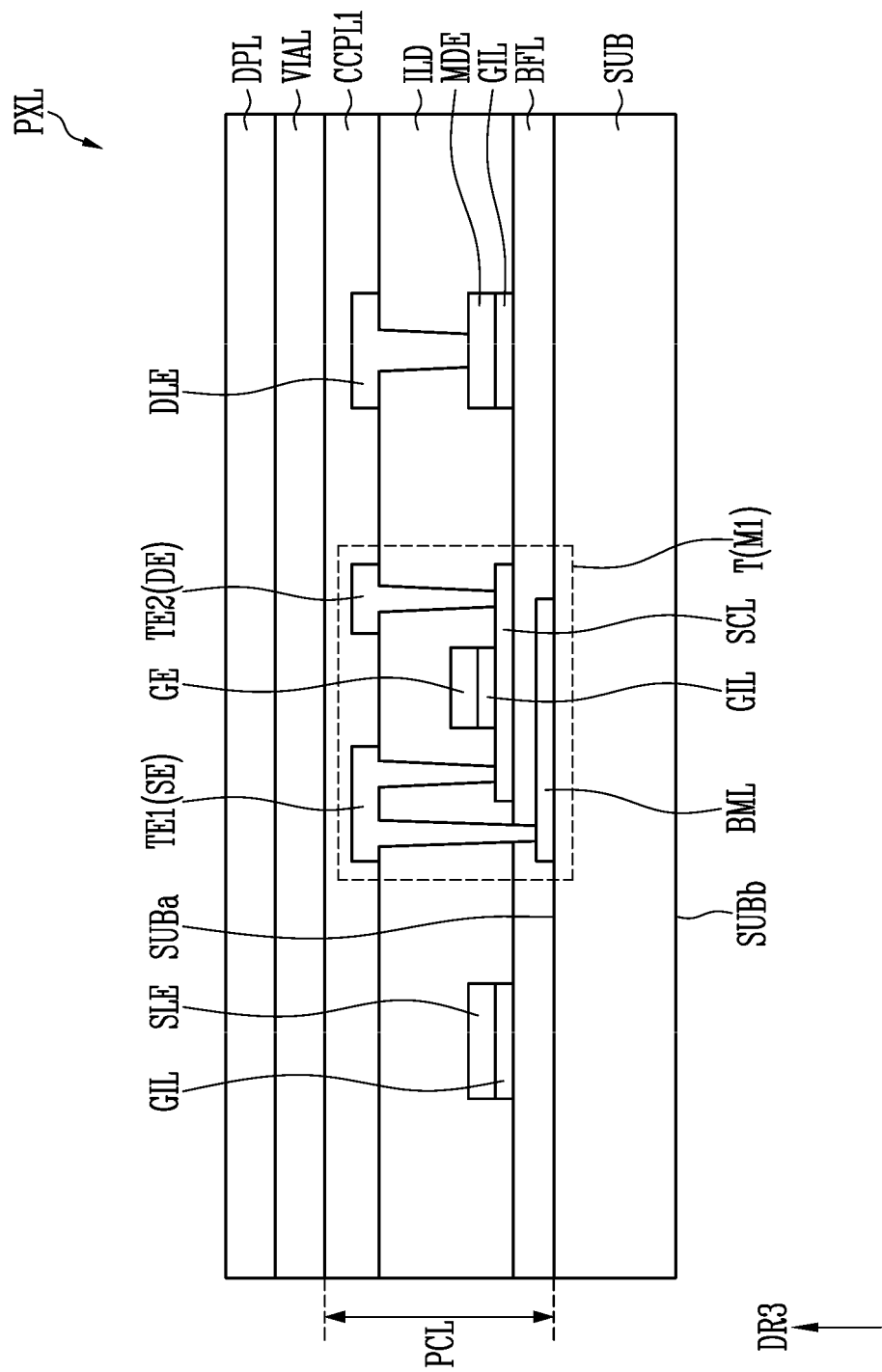
FIGS. 10 to 13 are cross-sectional views showing a method of manufacturing a display device according to an embodiment.
Figure 11:
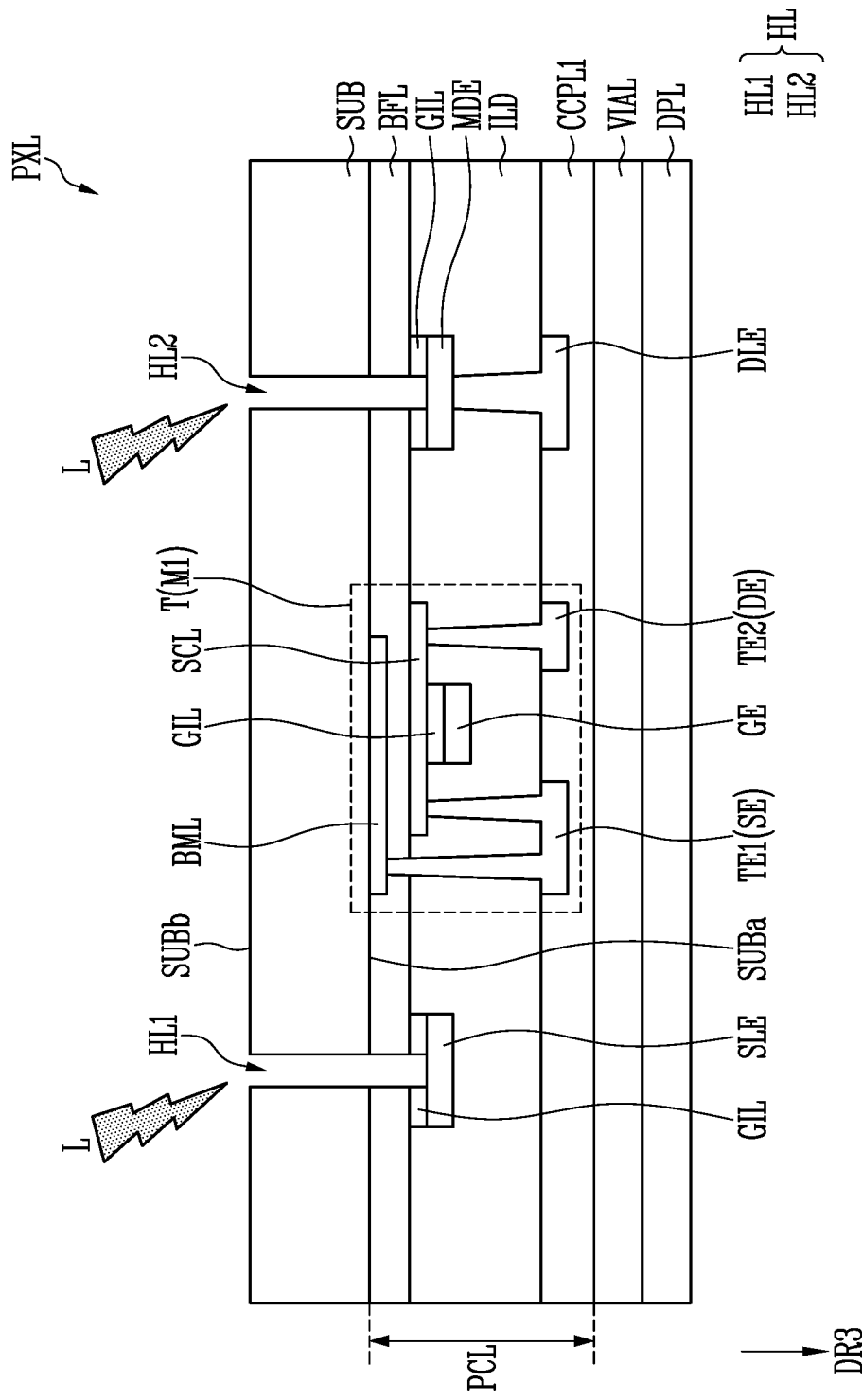
Figure 12:
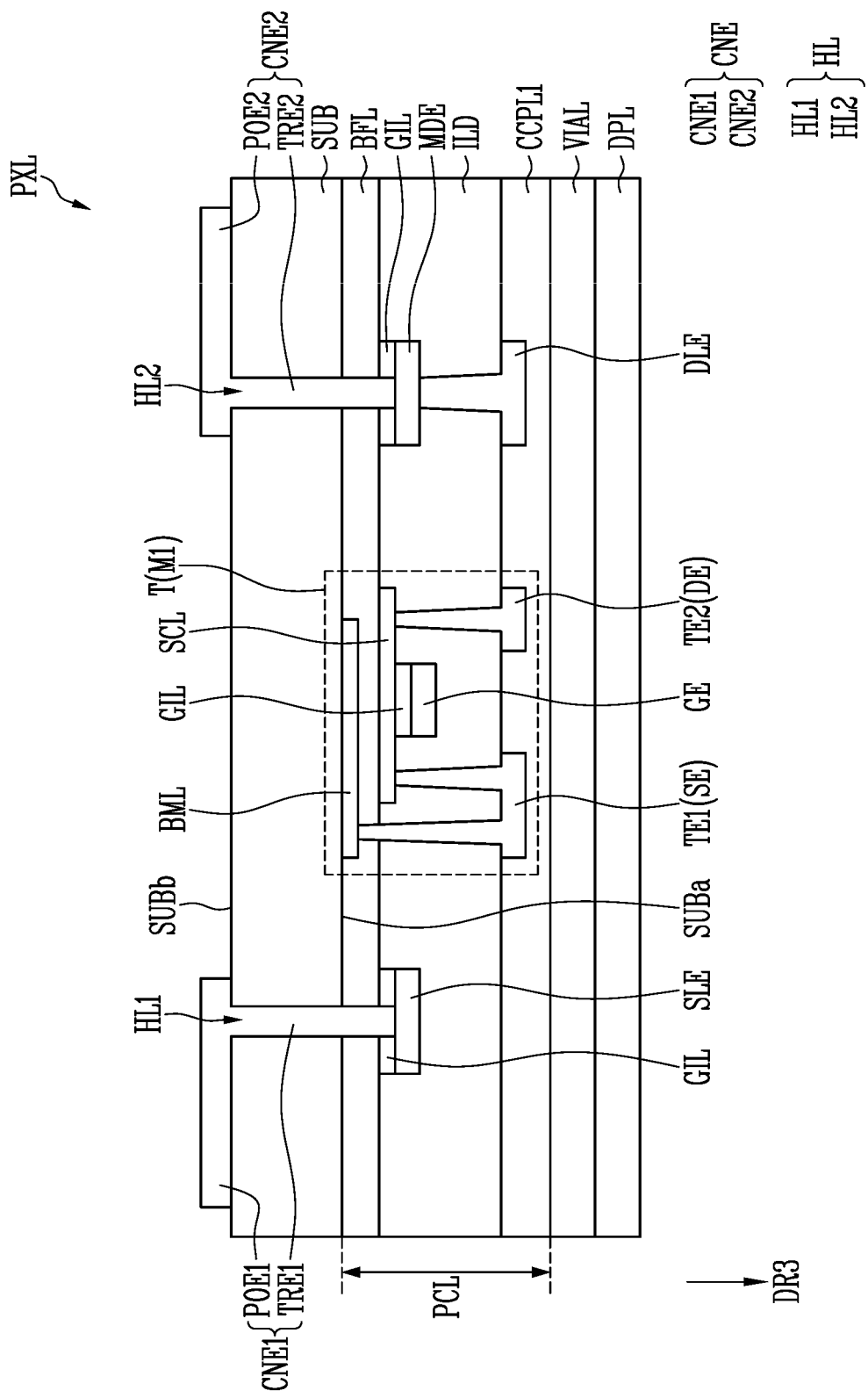
Figure 13:
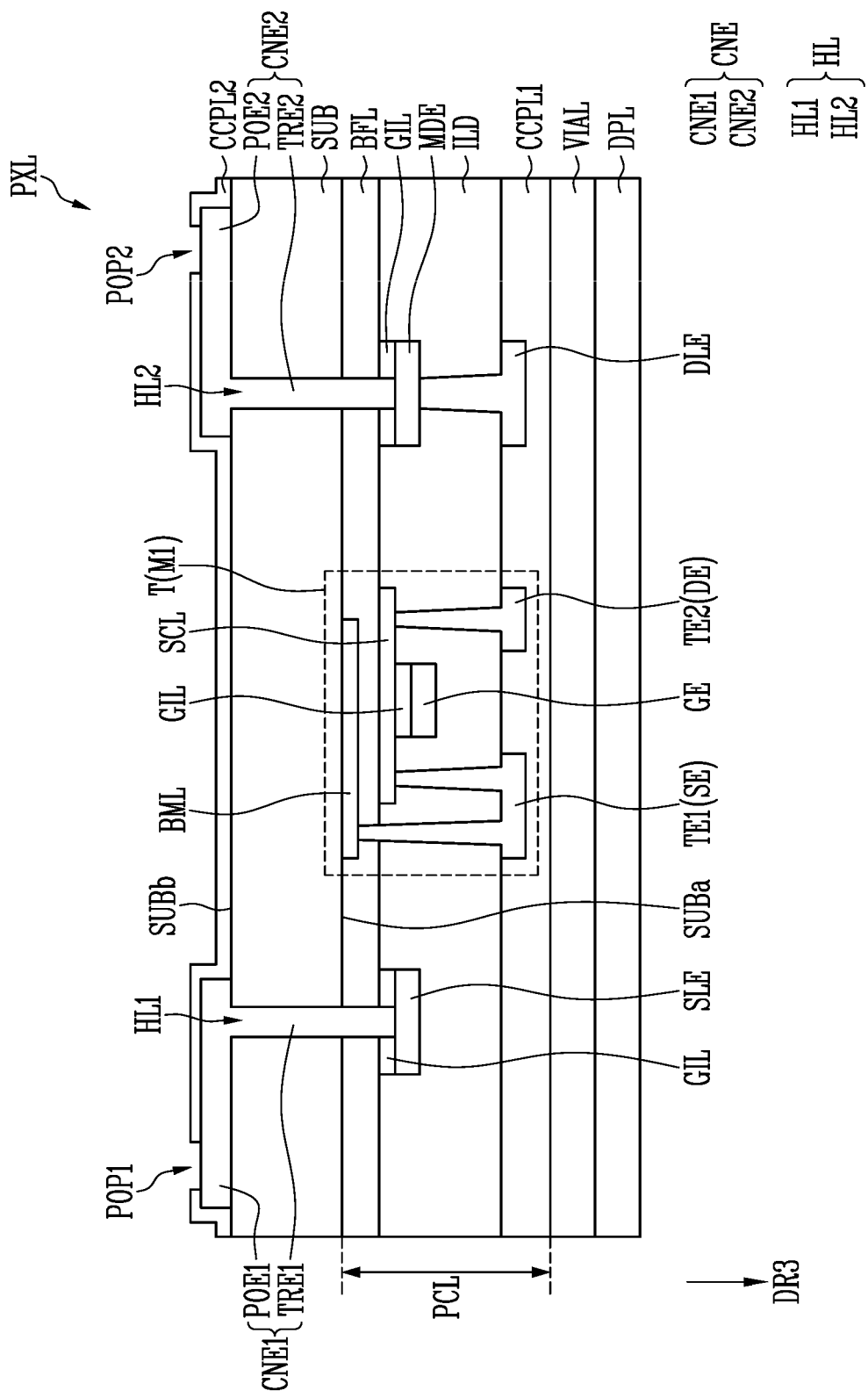

FIG. 8 is a cross-sectional view illustrating an embodiment showing how the pixel circuit layer and the driver are electrically connected to each other. FIG. 9 is a cross-sectional view illustrating another embodiment showing how the pixel circuit layer and the driver are electrically connected to each other. The cross-sectional views of FIGS. 8 and 9 may be cross-sectional views corresponding to the line VII-VII' of FIG. 6, but are not limited thereto.

In addition, for convenience of description, the cross-sectional views of FIGS. 8 and 9 show first and second adhesive members, the first and second connection films, and the driver together, but these configurations are shown in order to clearly describe a connection relationship, and a disposition position of the configurations may be different.

The pixel circuit layer PCL may include a plurality of circuit elements configuring a driving circuit of the pixels PXL. FIGS. 8 and 9 show a structure in which the pixel circuit layer PCL includes a transistor T. In particular, FIGS. 8 and 9 show, as an example, a structure of the first transistor M1 of the pixel circuit layer PCL shown in FIGS. 4A to 4C. However, the pixel circuit layer PCL is not limited thereto, and the other circuit elements as described in FIGS. 4A to 4B and 5 may be further included therein.

The transistors included in the pixel circuit layer PCL may have substantially the same or similar cross-sectional structure. In addition, a structure of each of the transistors is not limited to the structures exemplified in FIGS. 8 and 9.

Referring to FIGS. 3A, 8, and 9, the pixel circuit layer PCL may include a plurality of layers. For example, the pixel circuit layer PCL may include a buffer layer BFL, a gate insulating layer GIL, and an interlayer insulating layer ILD, which are sequentially stacked on the upper surface SUBa of the substrate SUB. The above-described layers may be insulating layers including an organic insulating material or an inorganic insulating material.

The buffer layer BFL may prevent (or substantially prevent) an impurity from diffusing into each circuit element. The buffer layer BFL may be provided as a single layer but may also be provided as multiple films (e.g., as two or more layers). When the buffer layer BFL is provided as multiple films, each layer may be formed of the same material or different materials. The buffer layer BFL may be omitted according to the material, process condition, and the like of the substrate SUB.

The transistor T, a scan line electrode SLE, a data line electrode DLE, and an intermediate electrode MDE may be disposed on the substrate SUB. The transistor T may include a body electrode layer BML, a semiconductor layer SCL, a gate electrode GE, a first transistor electrode TE1, and a second transistor electrode TE2.

The body electrode layer BML may be formed between the substrate SUB and the buffer layer BFL. The body electrode layer BML may include a metal material and may be electrically connected to at least a portion of the semiconductor layer SCL by the first transistor electrode TE1, which will be described later.

The semiconductor layer SCL may be disposed between the buffer layer BFL and the gate insulating layer GIL. The semiconductor layer SCL may include a first region that contacts the first transistor electrode TE1, a second region that contacts the second transistor electrode TE2, and a channel region positioned between the first and second regions. One of the first and second regions may be a source region, and the other may be a drain region. At least a portion of the semiconductor layer SCL may overlap the body electrode layer BML. For example, at least a portion of the channel region of the semiconductor layer SCL may overlap the body electrode layer BML.

The semiconductor layer SCL may be a semiconductor pattern including (or formed of) polysilicon, amorphous silicon, oxide semiconductor, or the like. In addition, the channel region of the semiconductor layer SCL may be an intrinsic semiconductor (e.g., a semiconductor pattern in which an impurity is not doped), and each of the first and second regions of the semiconductor layer SCL may be a semiconductor pattern in which an impurity is doped.

The gate electrode GE may be disposed between the gate insulating layer GIL and the interlayer insulating layer ILD and may overlap at least a portion of the semiconductor layer SCL. The gate electrode GE may be insulated from the semiconductor layer SCL by the gate insulating layer GIL.

The first transistor electrode TE1 and the second transistor electrode TE2 may be disposed on the interlayer insulating layer ILD. The first transistor electrode TE1 and the second transistor electrode TE2 may be electrically connected to the semiconductor layer SCL. For example, the first transistor electrode TE1 may contact the first region of the semiconductor layer SCL through a first contact opening (e.g., a first contact hole) CNT1 passing through the interlayer insulating layer ILD, and the second transistor electrode TE2 may contact the second region of the semiconductor layer SCL through a second contact opening (e.g., a second contact hole) CNT2 passing through the interlayer insulating layer ILD. According to an embodiment, the first transistor electrode TE1 may also contact the body electrode layer BML through a third contact opening (e.g., a third contact hole) CNT3 passing through the interlayer insulating layer ILD and the buffer layer BFL.

One of the first transistor electrode TE1 and the second transistor electrode TE2 may be a source electrode SE, and the other one may be a drain electrode DE. For example, the first transistor electrode TE1 may be the source electrode SE, and the second transistor electrode TE2 may be the drain electrode DE but are not limited thereto.

A first circuit capping layer CCPL1 may be disposed on the first transistor electrode TE1 and the second transistor electrode TE2. The first circuit capping layer CCPL1 may be an inorganic insulating layer including (or formed of) an inorganic material. The first circuit capping layer CCPL1 may protect circuit elements of the pixel circuit layer PCL from external oxygen and/or moisture.

The scan line electrode SLE and the intermediate electrode MDE may be disposed on the same layer as the gate electrode GE. For example, the scan line electrode SLE and the intermediate electrode MDE may be disposed between the gate insulating layer GIL and the interlayer insulating layer ILD.

The scan line electrode SLE may be an electrode connected to the scan line SL (see, e.g., FIG. 2A) of the display device 100. The scan line electrode SLE may be electrically connected to the scan driver SDV, which will be described in more detail below. The scan line electrode SLE may be connected to the driving circuit of the pixel circuit layer PCL to transfer the scan signal to the pixel PXL.

The data line electrode DLE may be disposed on the same layer as the first transistor electrode TE1 and the second transistor electrode TE2. For example, the data line electrode DLE may be disposed between the interlayer insulating layer ILD and the first circuit capping layer CCPL1.

The data line electrode DLE may be an electrode connected to the data line DL (see, e.g., FIG. 2A) of the display device 100. The data line electrode DLE may be connected to the data driver DDV, which will be described in more detail below. The data line electrode DLE may be connected to the driving circuit of the pixel circuit layer PCL to transfer the data signal to the pixel PXL. The data line electrode DLE may contact the intermediate electrode MDE through a fourth contact opening (e.g., a fourth contact hole) CNT4 passing through the interlayer insulating layer ILD.

The drivers DV may be disposed on the lower surface SUBb of the substrate SUB. The drivers DV may include the scan driver SDV electrically connected to the scan line electrode SLE and the data driver DDV electrically connected to the data line electrode DLE.

The scan driver SDV and the data driver DDV disposed on the lower surface SUBb of the substrate SUB may be connected to the pixel circuit layer PCL through the connection portion CNE. For example, the scan driver SDV may be connected to the scan line electrode SLE through the first connection portion CNE1, and the data driver DDV may be connected to the data line electrode DLE through the second connection portion CNE2.

The first connection portion CNE1 may include a first through electrode TRE1 and a first fan-out electrode POE1. The first through electrode TRE1 may be disposed to fill the first opening HL1 passing through the substrate SUB, the buffer layer BFL, and the gate insulating layer GIL and may contact the scan line electrode SLE. A shape of the first through electrode TRE1 may correspond to a shape of the first opening HL1. For example, the shape of the first through electrode TRE1 may include a cylindrical shape or a truncated cone shape. When the first through electrode TRE1 has the truncated cone shape, the first through electrode TRE1 may have a larger area at the lower surface SUBb than at the upper surface SUBa of the substrate SUB but is not limited thereto.

The first fan-out electrode POE1 may be disposed on the lower surface SUBb of the substrate SUB.

The first through electrode TRE1 and the first fan-out electrode POE1 may include the same material as each other and may be integrally formed but are not limited thereto. For example, the first through electrode TRE1 and the first fan-out electrode POE1 may include metal, such as Al, Mg, Ag, Pt, Pd, Au, Ni, Nd, Ir, Cr, Ti, and an alloy thereof.

The second connection portion CNE2 may include a second through electrode TRE2 and a second fan-out electrode POE2. The second through electrode TRE2 may be disposed to fill the second opening HL2 passing through the substrate SUB, the buffer layer BFL, and the gate insulating layer GIL and may contact the intermediate electrode MDE.

A shape of the second through electrode TRE2 may correspond to a shape of the second opening HL2. For example, the shape of the second through electrode TRE2 may include a cylindrical shape or a truncated cone shape. When the second through electrode TRE2 has the truncated cone shape, the second through electrode TRE2 may have a larger area at the lower surface SUBb than at the upper surface SUBa of the substrate SUB but is not limited thereto.

In addition, the second through electrode TRE2 may have substantially the same shape as the first through electrode TRE1, but is not limited thereto.

The second fan-out electrode POE2 may be disposed on the lower surface SUBb of the substrate SUB.

The second through electrode TRE2 and the second fan-out electrode POE2 may include the same material as each other and may be integrally formed but are not limited thereto. For example, the second through electrode TRE2 and the second fan-out electrode POE2 include metal, such as Al, Mg, Ag, Pt, Pd, Au, Ni, Nd, Ir, Cr, Ti, and an alloy thereof.

As described above, the data line electrode DLE may be connected to the intermediate electrode MDE through the fourth contact opening CNT4, and the data line electrode DLE may be connected to the second connection portion CNE2 through the intermediate electrode MDE.

A first depth D1 of the first opening HL1 may be substantially the same as a second depth D2 of the second opening HL2. Although the second opening HL2 does not pass through the interlayer insulating layer ILD, the second connection portion CNE2 may be connected to the data line electrode DLE through the intermediate electrode MDE.

A second circuit capping layer CCPL2 covering the first connection portion CNE1 and the second connection portion CNE2 may be disposed on the lower surface SUBb of the substrate SUB. The second circuit capping layer CCPL2 may entirely cover the first connection portion CNE1 and the second connection portion CNE2 and may include a first pad opening POP1 exposing a portion of the first connection portion CNE1 and a second pad opening POP2 exposing a portion of the second connection portion CNE2.

A first adhesive member ACF1 may be disposed in the first pad opening POP1, and a second adhesive member ACF2 may be disposed in the second pad opening POP2. The first adhesive member ACF1 and the second adhesive member ACF2 may be configured as an anisotropic conductive film but are not limited thereto.

An upper surface of the first adhesive member ACF1 may contact the first connection portion CNE1 through the first pad opening POP1. A first connection film COF1 may be attached to a lower surface of the first adhesive member ACF1. The first connection film COF1 may be electrically connected to the first connection portion CNE1 through the first adhesive member ACF1.

The scan driver SDV may be attached to the first connection film COF1. The scan driver SDV may generate the scan signal, and the generated scan signal may be provided to the scan line electrode SLE through the first connection portion CNE1.

An upper surface of the second adhesive member ACF2 may contact the second connection portion CNE2 through the second pad opening POP2. A second connection film COF2 may be attached to a lower surface of the second adhesive member ACF2. The second connection film COF2 may be electrically connected to the second connection portion CNE2 through the second adhesive member ACF2.

The data driver DDV may be attached to the second connection film COF2. The data driver DDV may generate the data signal, and the generated data signal may be provided to the data line electrode DLE through the second connection portion CNE2.

Accordingly, the pixel circuit layer PCL may receive the scan signal from the scan driver SDV through the first connection portion CNE1 passing through the substrate SUB and may receive the data signal from the data driver DDV through the second connection portion CNE2 passing through the substrate SUB. The pixel circuit layer PCL may generate a driving signal (e.g., a driving current) corresponding to the provided scan signal and data signal and provide the driving signal (e.g., the driving current) to the display element layer DPL.

In another embodiment, as shown in FIG. 9, the pixel circuit layer PCL of a pixel PXLa may not include the intermediate electrode MDE. In this embodiment, a second opening (e.g., a second hole) HL2a may be formed to have a second depth D2a by passing through the substrate SUB, the buffer layer BFL, and the interlayer insulating layer ILD, and a second through electrode TRE2a of a second connection portion CNE2a may fill the second opening HL2a to directly contact the data line electrode DLE.

As described above, when the driver DV is disposed on the lower surface SUBb of the substrate SUB, the non-display area NDA for connecting (or disposing) the driver DV to the upper surface SUBa of the substrate SUB may be unnecessary. Thus, the non-display area NDA may be reduced, and the display area DA of the display device 100 may be expanded.

Because the display element layer DPL of the display device 100 according to the present embodiment includes (or is formed of) an inorganic material and includes the light emitting element LD having a strong characteristic against oxygen and moisture, even though the openings HL passing through the substrate SUB are formed in the display area DA of the substrate SUB, the reliability of the display device 100 may not be substantially affected. Different from the present disclosure, when the display element layer DPL of the display device 100 includes an organic light emitting diode, oxygen and/or moisture may permeate and the reliability of the display device 100 may be negatively affected due to, for example, damage to the display element layer DPL due to the openings HL passing through the substrate SUB in the display area DA.

In addition, because the display device 100 according to the present disclosure includes the light emitting element LD having a strong characteristic against oxygen and moisture, a separate encapsulation substrate and a sealing member disposed on an edge of the substrate SUB may be omitted. For example, in the display device 100 according to the present disclosure, because the separate encapsulation substrate and sealing member may be omitted, the non-display area NDA may be reduced or minimized, and the display area DA of the display device 100 may be further expanded.

As described above, when forming the openings HL passing through the substrate SUB and forming the connection portions CNE filling the openings HL, the drivers SDV and DDV may be disposed on the lower surface SUBb of the substrate SUB. Accordingly, the non-display area for disposing the drivers SDV and DDV may be reduced, and a wide display area may be secured.

In addition, when the intermediate electrode MDE is formed on the same layer as the scan line electrode SLE, because the first depth D1 of the first opening HL1 and the second depth D2 of the second opening HL2 are identical (or substantially identical) to each other, the connection portion CNE may be easily formed. For example, reliability of the display device may be improved by preventing or substantially reducing a contact defect or the like between the first connection portion CNE1 and the scan line electrode SLE and between the second connection portion CNE2 and the intermediate electrode MDE.

FIGS. 10 to 13 are cross-sectional views showing a method of manufacturing the display device according to an embodiment. For example, FIGS. 10 to 13 are cross-sectional views primarily showing a method of manufacturing the pixel circuit layer of the display device. FIGS. 10 to 13 are cross-sectional views sequentially showing a method of manufacturing the pixel circuit layer shown in FIG. 8.

First, referring to FIGS. 2A to 3B, 7, 8, and 10, the pixel circuit layer PCL and the display element layer DPL may be formed on the upper surface SUBa of the substrate SUB.

The pixel circuit layer PCL may include the transistor T, the scan line electrode SLE, the data line electrode DLE, and the intermediate electrode MDE. As described above, the data line electrode DLE may be disposed on a layer different from that of the scan line electrode SLE. The data line electrode DLE may be connected to the intermediate electrode MDE disposed on the same layer as the scan line electrode SLE through a contact opening.

The display element layer DPL may be disposed on the pixel circuit layer PCL. In this embodiment, the display element layer DPL may be disposed on the via layer VIAL, which is disposed on the pixel circuit layer PCL. However, as shown in FIG. 3B, when the display element layer DPL and the pixel circuit layer PCL do not overlap in the third direction DR3, the display element layer DPL may be formed on the upper surface SUBa of the substrate SUB. In this embodiment, at least one configuration of the display element layer DPL and at least one configuration of the pixel circuit layer PCL may be formed by the same process.

As described with reference to FIG. 7, the display element layer DPL may include the first electrode RFE1 and the second electrode RFE2 disposed on the same layer and spaced apart from each other. In addition, the display element layer DPL may include the light emitting element LD disposed between the first electrode RFE1 and the second electrode RFE2. In addition, after the light emitting element LD is disposed, the wavelength conversion layer WCL and the color filter layer CFL may be further disposed on the light emitting element LD. The wavelength conversion layer WCL may include the wavelength conversion particle QD to convert the wavelength (or color) of the light emitted from the light emitting element LD. The wavelength conversion layer WCL may further include the scattering particle SCT to improve side visibility of the display device.

In addition, the configurations and structure of the display element layer DPL are substantially the same as those described above with reference to FIG. 7, and thus, repetitive descriptions may be omitted.

Next, referring to FIGS. 2A to 3B, 8 and 11, the openings HL passing through the substrate SUB and exposing at least a portion of the pixel circuit layer PCL may be formed.

In order to form the openings HL in the substrate SUB, the substrate SUB may be inverted up and down. Accordingly, the pixel circuit layer PCL and the display element layer DPL disposed on the upper surface SUBa of the substrate SUB may also be inverted up and down together. A protective film for protecting the display element layer DPL and/or the pixel circuit layer PCL may be further attached on the display element layer DPL and/or the pixel circuit layer PCL.

For example, the openings HL may be formed on the lower surface SUBb of the inverted substrate SUB through a laser L process (e.g., a laser etching process). As another example, the openings HL may be formed through a punching process, an etching process, or the like.

As shown in FIG. 2B, an area in which the openings HL are formed may be inside the display area DA of the display device 100.

The openings HL may include the first opening HL1 and the second opening HL2. The first opening HL1 may pass through the substrate SUB, the buffer layer BFL, and the gate insulating layer GIL to expose at least a portion of the scan line electrode SLE. The second opening HL2 may pass through the substrate SUB, the buffer layer BFL, and the gate insulating layer GIL to expose at least a portion of the intermediate electrode MDE. According to an embodiment, when the pixel circuit layer PCL does not include the intermediate electrode MDE, the second opening HL2 may also pass through the interlayer insulating layer ILD to expose at least a portion of the data line electrode DLE (see, e.g., FIG. 9).

Next, referring to FIGS. 2A to 3B, 8, and 12, the connection portion CNE filling the openings HL and contacting the at least a portion of the exposed pixel circuit layer PCL may be formed on the lower surface SUBb of the substrate SUB.

The connection portion CNE may include the first connection portion CNE1 and the second connection portion CNE2. The first connection portion CNE1 may include the first through electrode TRE1 filling the first opening HL1 and the first fan-out electrode POE1 formed on the lower surface SUBb of the substrate SUB. The first through electrode TRE1 may contact the scan line electrode SLE.

The second connection portion CNE2 may include the second through electrode TRE2 filling the second opening HL2 and the second fan-out electrode POE2 formed on the lower surface SUBb of the substrate SUB. The second through electrode TRE2 may contact the intermediate electrode MDE and may be electrically connected to the data line electrode DLE through the intermediate electrode MDE.

As shown in FIG. 2B, the first connection portion CNE1 (e.g., the first fan-out electrode POE1) and the second connection portion CNE2 (e.g., the second fan-out electrode POE2) formed on the lower surface SUBb of the substrate SUB may be formed by conductive lines and may be formed to be concentrated toward the scan driver SDV and the data driver DDV, respectively. For example, a plurality of first connection portions CNE1 (e.g., first fan-out electrodes POE1) connected to the scan lines SL may be formed to be concentrated toward a corresponding scan driver SDV, and a plurality of second connection portions CNE2 (e.g., second fan-out electrodes POE2) connected to the data lines DL may be formed to be concentrated toward a corresponding data driver DDV.

Next, referring to FIGS. 2A to 3B, 8, and 13, the second circuit capping layer CCPL2 may be formed on the lower surface SUBb of the substrate SUB to expose at least a portion of the connection portion CNE.

The second circuit capping layer CCPL2 may be formed to have a substantially uniform thickness along the lower surface SUBb of the substrate SUB and a surface of the first connection portion CNE1 and the second connection portion CNE2 disposed on the lower surface SUBb of the substrate SUB.

The second circuit capping layer CCPL2 may include the first pad opening POP1 and the second pad opening POP2. The first pad opening POP1 may expose at least a portion of the first connection portion CNE1 to the outside, and the second pad opening POP2 may expose at least a portion of the second connection portion CNE2 to the outside.

In an embodiment, the first pad opening POP1 and the second pad opening POP2 may be formed through a separate etching process after forming an inorganic insulating film on the entire lower surface SUBb of the substrate SUB, the first connection portion CNE1, and the second connection portion CNE2 but is not limited thereto.

After the first pad opening POP1 and the second pad opening POP2 are formed, as shown in FIG. 8, the first adhesive member ACF1 and the second adhesive member ACF2 may be formed. The first connection film COF1 and the scan driver SDV may be electrically connected to the first adhesive member ACF1, and the second connection film COF2 and the data driver DDV may be electrically connected to the second adhesive member ACF2.

As described above, by forming the openings HL passing through the substrate SUB and forming the connection portion CNE filling the opening HL, the drivers SDV and DDV may be disposed on the lower surface SUBb of the substrate SUB. Accordingly, the non-display area for disposing the drivers SDV and DDV may be reduced and a wide display area may be secured.

In addition, when the intermediate electrode MDE is formed on the same layer as the scan line electrode SLE, the first depth D1 of the first opening HL1 and the second depth D2 of the second opening HL2 may be identical (or substantially identical) to each other and the connection portion CNE may be easily formed. For example, reliability of the display device may be improved by preventing (or substantially preventing) a contact defect or the like between the first connection portion CNE1 and the scan line electrode SLE and between the second connection portion CNE2 and the intermediate electrode MDE.

Figure 14:
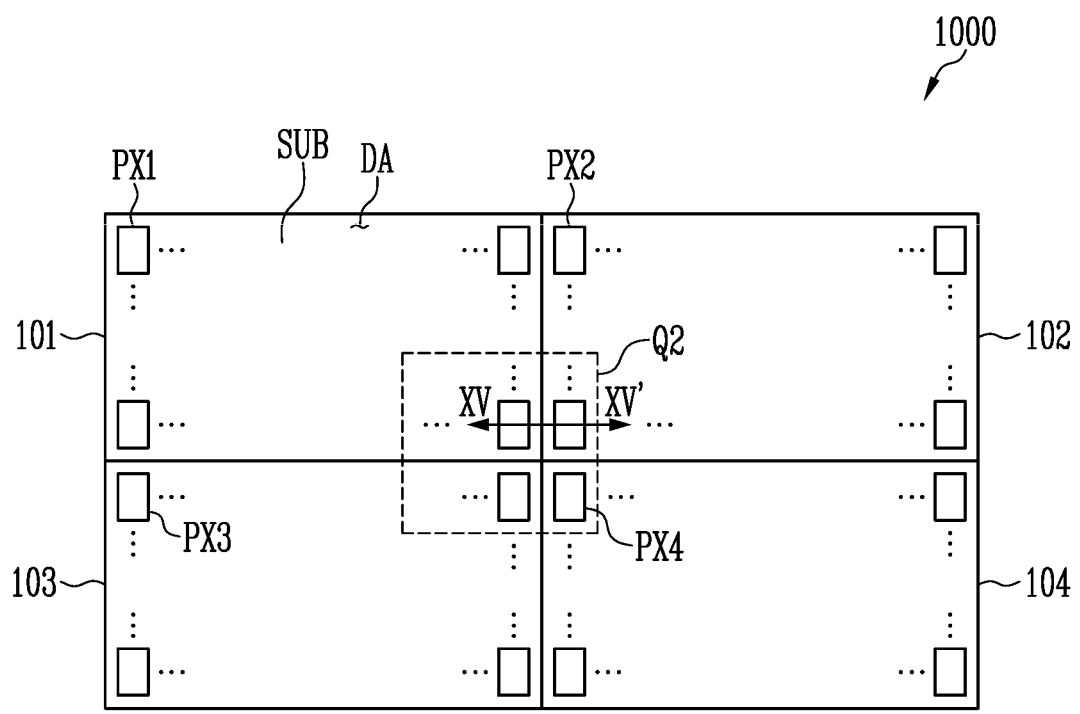
FIG. 14 is a plan view illustrating a tiled display device according to an embodiment.
Figure 15:
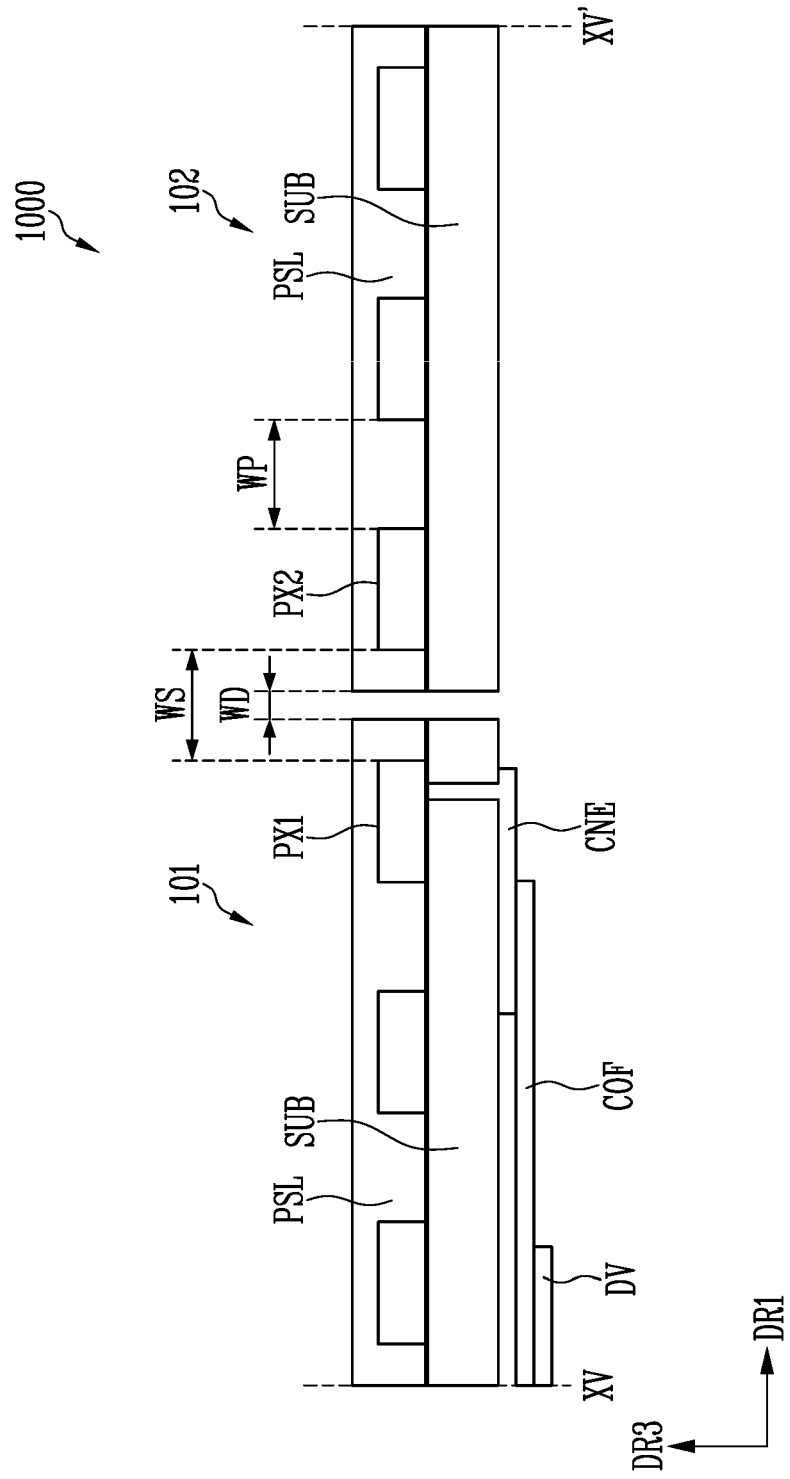
FIG. 15 is a cross-sectional view taken along the line XV-XV' of FIG. 14.
Figure 16:
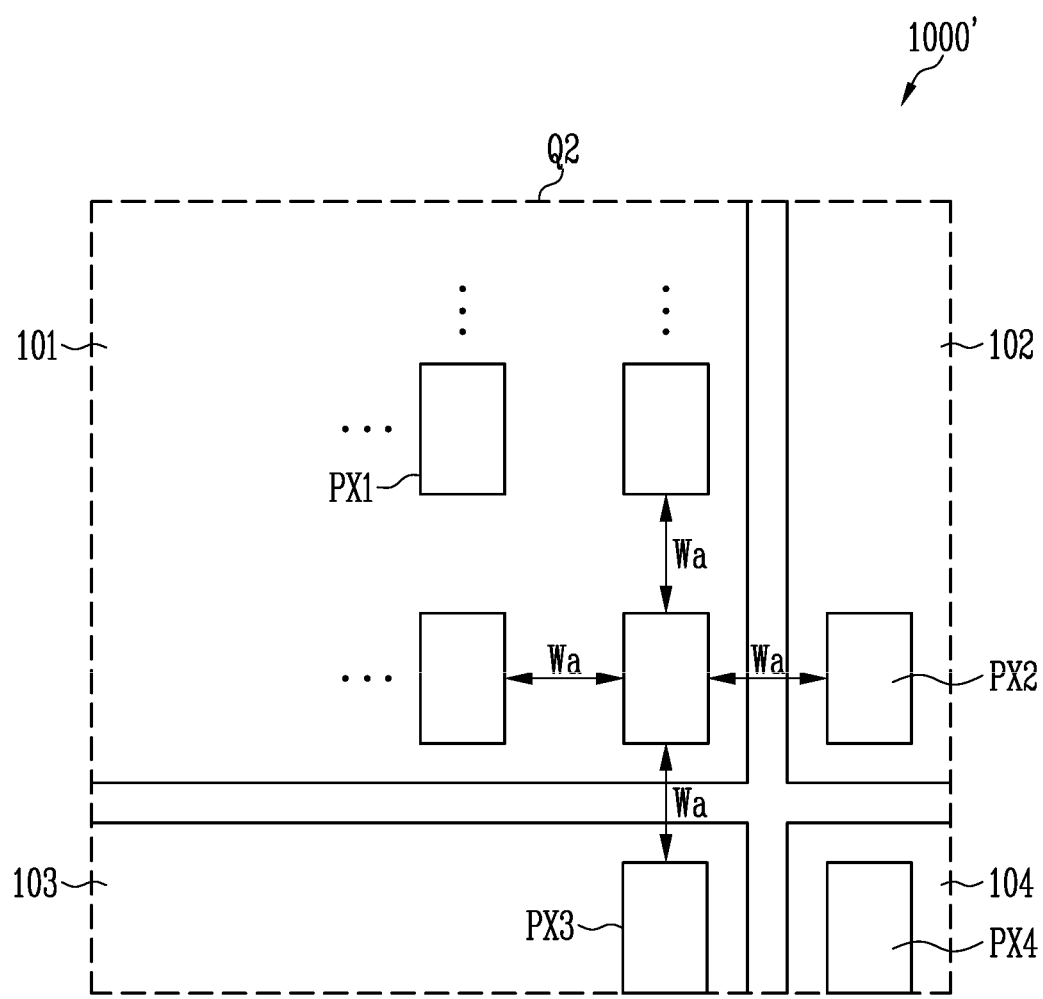
FIG. 16 is a plan view illustrating an example of the Q2 region of FIG. 14.

FIG. 14 is a plan view illustrating a tiled display device according to an embodiment, FIG. 15 is a cross-sectional view taken along the line XV-XV' of FIG. 14, and FIG. 16 is a plan view illustrating an example of the Q2 region of FIG. 14.

Referring to FIGS. 14 to 16, the tiled display device 1000 may include a plurality of display panels 100. Each of the display panels 100 may be configured corresponding to the display device 100 described above with reference to FIGS. 2A to 9. The same or similar reference numerals are used for repetitive components, and detailed description thereof may be omitted.

The tiled display device 1000 may be formed by connecting two or more display panels 100. In FIG. 14, four display panels 100 are connected in a 2×2 array, but the arrangement and the number of display panels 100 included in the tiled display device 1000 are not limited thereto.

In an embodiment of the present disclosure, the display panels 100 included in the tiled display device 1000 may be in close contact with each other and mounted in a chassis or may be connected through separate coupling components.

A buffer may be disposed between each of the display panels 100 to prevent damage due to collision but is not limited thereto. For example, a transparent tape or a transparent resin may be disposed between each of the display panels 100 to connect the display panels 100.

By interposing such coupling components and/or buffer, at least some distance WD may be present between the display panels 100. When the distance WD between adjacent display panels 100 is greater than a distance WS between the outermost pixels by a reference distance or more, a boundary between the display panels 100 may be visually recognized, and thus, a visibility defect may occur.

The respective display panels 100 may independently output different images. However, the respective display panels 100 may share one image with each other, divide the one image into a plurality of images, and output the plurality of images.

In the present embodiment, the tiled display device 1000 may include a first display panel 101, a second display panel 102, a third display panel 103, and a fourth display panel 104. The tiled display device 1000 may include a plurality of pixels PXL disposed on each of the display panels 100.

For example, the first display panel 101 may include a plurality of pixels PX1 disposed in the display area DA of the substrate SUB. The second display panel 102 may include a plurality of pixels PX2 disposed in the display area DA of the substrate SUB. The third display panel 103 may include a plurality of pixels PX3 disposed in the display area DA of the substrate SUB. The fourth display panel 104 may include a plurality of pixels PX4 disposed in the display area DA of the substrate SUB.

The protective layer PSL may be disposed on each of the display panels 100 to cover the substrate SUB and the plurality of pixels PXL disposed on the substrate SUB.

Each of the display panels 100 may include the driver DV disposed under the substrate SUB. The driver DV may be attached to the connection film COF to be electrically connected thereto. The connection film COF to which the driver DV is attached may be connected to the pixels PXL through the connection portion CNE passing through the substrate SUB. For example, the driver DV disposed under the substrate SUB of the first display panel 101 may be connected to the pixels PX1 through the connection film(s) COF and the connection portion(s) CNE.

Because the driver DV is disposed under the substrate SUB, the non-display area of each of the display panels 100 may be reduced. For example, when the driver DV is disposed on the upper surface of the substrate SUB, a separate area for disposing the driver DV may be required. The area in which the driver DV is disposed may be the non-display area in which the pixels PXL may not be disposed.

For example, the distance WS between the pixels PXL positioned at the outermost portion of the different display panels 100 may be equal to or less than the distance WP between the pixels PXL of one display panel. For example, the distance WS between the pixel PX1 disposed in the outermost portion of the first display panel 101 and the pixel PX2 disposed in the outermost portion of the second display panel 102 may be equal to or less than the distance WP between the pixels PX2 of the second display panel 102.

In another example, as shown in FIG. 16, all gaps between the pixels PXL of a tiled display device 1000' may be the same.

For example, the pixels PX1 of the first display panel 101 may be disposed to be spaced apart from each other at a first distance Wa along the first direction DR1 and the second direction DR2. The outermost pixel from among the pixels PX1 of the first display panel 101 and the outermost pixel from among the pixels PX2 of the second display panel 102, which is adjacent to the first display panel 101 in the first direction DR1, may be disposed to be spaced apart at the first distance Wa along the first direction DR1. In addition, the outermost pixel from among the pixels PX1 of the first display panel 101 and the outermost pixel from among the pixels PX4 of the third display panel 103, which is adjacent to the first display panel 101 in the second direction DR2, may be disposed to be spaced apart at the first distance Wa along the second direction DR2. The first distance Wa may be the same distance as the distance WS between the adjacent pixels of the different display panels described above with reference to FIG. 15 but is not limited thereto.

As in the above-described embodiments, when the driver DV is disposed under the substrate SUB, the non-display area of the display panel 100 may be reduced, and the distance WD between each of the display panels 100 may be reduced. Accordingly, the display panels 100 of the tiled display device 1000 may not be recognized as separate screens by the user but may be recognized as a single screen.

Figure 17:
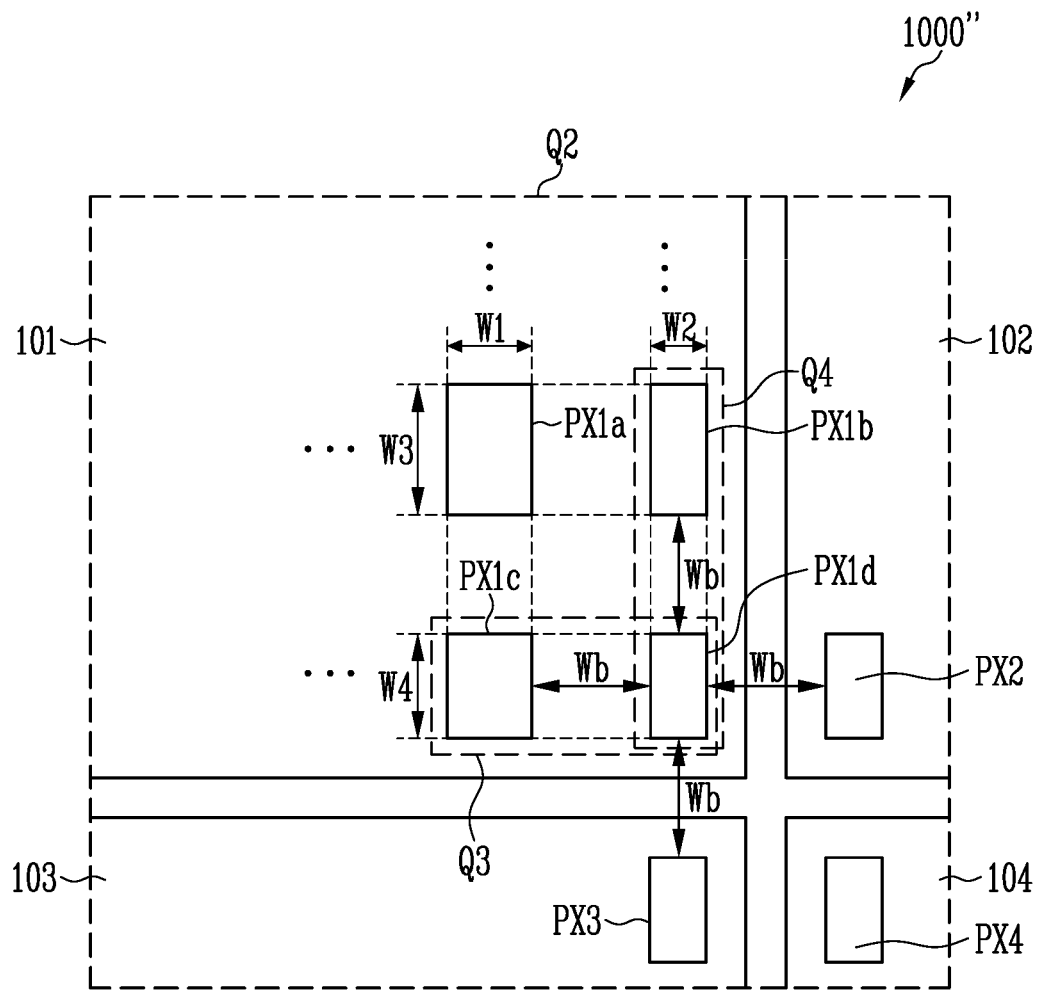
FIG. 17 is a plan view illustrating another example of the Q2 region of FIG. 14.
Figure 18:
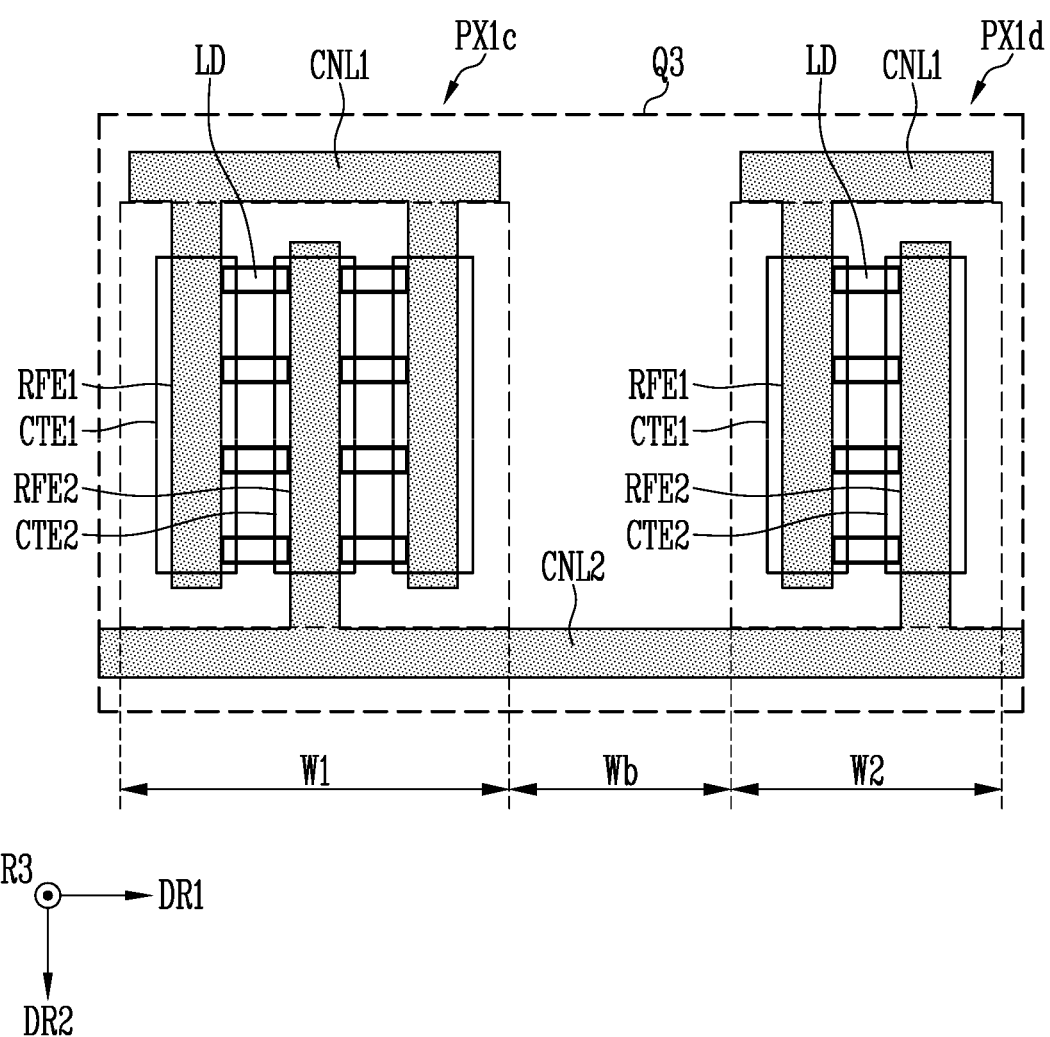
FIG. 18 is a plan view illustrating the Q3 region of FIG. 17.
Figure 19:
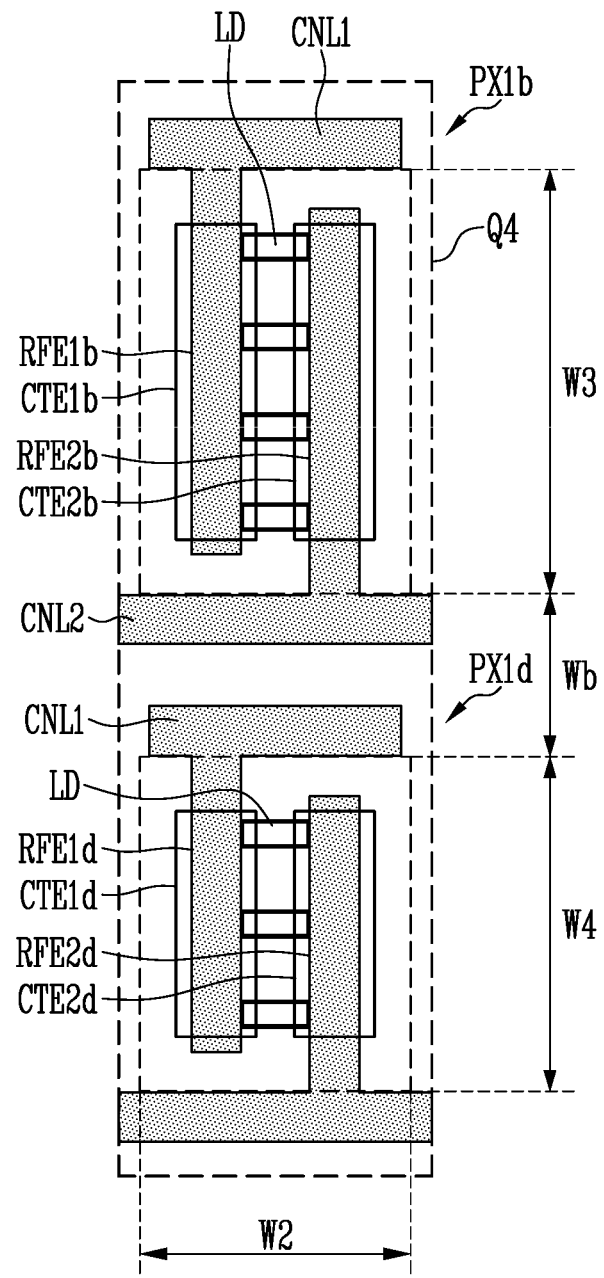
FIG. 19 is a plan view illustrating the Q4 region of FIG. 17.

FIG. 17 is a plan view illustrating another example of the Q2 region of FIG. 14, FIG. 18 is a plan view illustrating the Q3 region of FIG. 17, and FIG. 19 is a plan view illustrating the Q4 region of FIG. 17.

Referring to FIGS. 17 to 19, all pixels PXL" of a tiled display device 1000" may be disposed to be spaced apart at identical distances in the first direction DR1 and the second direction DR2. For example, all pixels PXL" of the tiled display device 1000" may be disposed at a second distance Wb.

For example, the pixel PX1 of the first display panel 101 and the pixel PX2 of the second display panel 102 adjacent to the first display panel 101 may be spaced apart at the second distance Wb, and the pixel PX1 of the first display panel 101 and the pixel PX3 of the third display panel 103 adjacent to the first display panel 101 may be spaced apart at the second distance Wb. However, widths of each of the pixels PXL" in the first direction DR1 and the second direction DR2 may be different from each other.

For example, the pixels PX1 of the first display panel 101 may include a 1a-th pixel PX1a, a 1b-th pixel PX1b, a 1c-th pixel PX1c, and a 1d-th pixel PX1d.

The 1a-th pixel PX1a may have a first width W1 in the first direction DR1 and a third width W3 in the second direction DR2. The 1b-th pixel PX1b may have a second width W2 in the first direction DR1 that is less than the first width W1 and the third width W3 in the second direction DR2. The 1c-th pixel PX1c may have the first width W1 in the first direction DR1 and a fourth width W4 in the second direction DR2 that is less than the third width W3. The 1d-th pixel PX1d may have the second width W2 in the first direction DR1 and the fourth width W4 in the second direction DR2. For example, the width of the 1d-th pixel PX1d of the first direction DR1 and the second direction DR2 may be less than that of the 1a-th pixel PX1a.

For example, as shown in FIG. 18, the 1c-th pixel PX1c may have the first width W1 in the first direction DR1, and the 1d-th pixel PX1d may have the second width W2 in the first direction DR1. The number of light emitting elements LD included the 1d-th pixel PX1d may be less than that of the 1c-th pixel PX1c such that the 1d-th pixel PX1d has a width that is less than that of the 1c-th pixel PX1c.

For example, the 1c-th pixel PX1c may include the first electrodes RFE1 disposed on both sides of the second electrode RFE2 and may include the light emitting elements LD in two columns aligned between the second electrode RFE2 and the first electrodes RFE1. On the other hand, the 1d-th pixel PX1d includes only one first electrode RFE1 and one second electrode RFE2 and may include the light emitting elements LD in one column aligned between the first electrode RFE1 and the second electrode RFE2.

In FIG. 18, a structure in which the 1c-th pixel PX1c includes the light emitting elements LD in two columns and the 1d-th pixel PX1d includes the light emitting elements LD in one column is described as an example, but the number of columns of the light emitting elements LD included in the 1c-th pixel PX1c and the 1d-th pixel PX1d may be greater. However, even in these other embodiments, the number of columns of the light emitting element LD included in the 1c-th pixel PX1c may be greater.

In addition, as shown in FIG. 19, the 1b-th pixel PX1b may have the third width W3 in the second direction DR2, and the 1d-th pixel PX1d may have the fourth width W4 in the second direction DR2. A length of electrodes included in the 1d-th pixel PX1d may be less than that of the electrodes in the 1b-th pixel PX1b such that the 1d-th pixel PX1d has a width that is less than that of the 1b-th pixel PX1b.

For example, a length of a first electrode RFE1d and a length of a second electrode RFE2d included in the 1d-th pixel PX1d may be less than a length of a first electrode RFE1b and a length of a second electrode RFE2b included in the 1b-th pixel PX1b.

For example, an area in which the light emitting elements LD of the 1d-th pixel PX1d are disposed may be less (or smaller) in the second direction DR2 than an area in which the light emitting elements LD of the 1b-th pixel PX1b are disposed.

As described above, from among the pixels PX1 of the first display panel 101, when the 1d-th pixel PX1d disposed in the outermost portion has widths in the first direction DR1 and the second direction DR2 that are less than those of the 1a-th pixel PX1a, a disposition density (e.g., an arrangement density) of the pixels PX1 may be increased. For example, because the disposition density of the pixels PXL" may be increased while maintaining the same distance between the pixels PXL", display quality of the tiled display device 1000" may be improved.

Because the pixels PXL" disposed in an outer portion of the display panels 100 are formed to have widths in the first direction DR1 and/or in the second direction DR2 that are less than the corresponding widths of the pixels PXL" that are not disposed in the outer portion, when the tiled display device 1000" is driven, corresponding pixels may be recognized as being darker by the user. Accordingly, in the present embodiment, the pixels PXL" disposed in the outer portion may be compensated to increase a display luminance. For example, the pixels PXL" at different areas may be adjusted to emit light having the same (or substantially the same) luminance and may be recognized as having the same brightness by the user.

Although embodiments of the present disclosure have been described with reference to the accompanying drawings, it will be understood by those skilled in the art to which the present disclosure pertains that these embodiments may be implemented in other suitable forms without changing the technical spirit of the present disclosure. Therefore, it should be understood that the embodiments described above are illustrative and are not restrictive in all aspects.

What is claimed is:

1. A display device comprising:
   a substrate having a display area configured to display an image;
   a pixel on a first surface of the substrate in the display area, the pixel comprising a display element layer and a pixel circuit layer;
   a first driver on a second surface of the substrate facing the first surface of the substrate in the display area; and
   a first connection portion passing through the substrate between the first surface and the second surface of the substrate in a first direction in the display area to electrically connect a first signal line of the pixel circuit layer and the first driver to each other,
   wherein the display element layer comprises:
   a first electrode and a second electrode on the same layer and spaced from each other such that the first electrode and the second electrode do not overlap each other in the first direction; and
   a light emitting element between the first electrode and the second electrode.

2. The display device according to claim 1, further comprising:

a second driver on the second surface of the substrate in the display area; and a second connection portion passing through the substrate between the first surface and the second surface of the substrate to electrically connect a second signal line of the pixel circuit layer and the second driver to each other, wherein the first driver is configured to supply a scan signal to the first signal line, and wherein the second driver is configured to supply a data signal to the second signal line.

3. The display device according to claim 2, wherein the pixel circuit layer further comprises a transistor electrically connected to the light emitting element, wherein the transistor comprises:
    a semiconductor layer on the first surface of the substrate;
    a gate electrode on the semiconductor layer; and
    a first transistor electrode and a second transistor electrode on the gate electrode and connected to the semiconductor layer, and wherein the first signal line is on the same layer as the gate electrode.

4. The display device according to claim 3, wherein the second signal line is on the same layer as at least one of the first transistor electrode and the second transistor electrode.

5. The display device according to claim 4, wherein the pixel circuit layer further comprises an intermediate electrode contacting the second signal line and the second connection portion, and wherein the intermediate electrode is on the same layer as the first signal line.

6. The display device according to claim 2, further comprising a capping layer on the second surface of the substrate and covering the first connection portion and the second connection portion, wherein the first connection portion comprises a first through electrode passing through the substrate and a first fan-out electrode on the second surface of the substrate, wherein the second connection portion comprises a second through electrode passing through the substrate and a second fan-out electrode on the second surface of the substrate, and wherein the capping layer has a first pad opening exposing a portion of the first fan-out electrode and a second pad opening exposing a portion of the second fan-out electrode.

7. The display device according to claim 6, further comprising:
    a first connection film electrically connected to the first fan-out electrode through the first pad opening; and
    a second connection film electrically connected to the second fan-out electrode through the second pad opening, wherein the first driver is on the first connection film, and wherein the second driver is on the second connection film.

8. The display device according to claim 1, wherein the display element layer comprises:
    an insulating layer on the first electrode and the second electrode;
    a third electrode contacting the first electrode and a first end portion of the light emitting element; and
    a fourth electrode contacting the second electrode and a second end portion of the light emitting element, wherein the insulating layer has a first opening exposing at least a portion of the first electrode and a second opening exposing at least a portion of the second electrode, wherein the third electrode contacts the first electrode through the first opening, and wherein the fourth electrode contacts the second electrode through the second opening.

9. The display device according to claim 1, wherein the display element layer comprises:
    a wavelength conversion layer on the light emitting element; and
    a color filter layer on the wavelength conversion layer, and wherein the wavelength conversion layer comprises a wavelength conversion particle and a scattering particle.

10. The display device according to claim 1, wherein the light emitting element comprises an inorganic material, and wherein the pixel comprises a plurality of the light emitting elements.

11. The display device according to claim 3, wherein the first connection portion terminates on a same layer as the gate electrode, and wherein the second connection portion extends above the gate electrode towards the display element layer.

* * * * *